(12) United States Patent
Xu et al.

(10) Patent No.: US 12,051,361 B2
(45) Date of Patent: Jul. 30, 2024

(54) PIXEL DRIVING CIRCUIT, DISPLAY PANEL, AND DISPLAY DEVICE

(71) Applicant: Xiamen Tianma Display Technology Co., Ltd., Xiamen (CN)

(72) Inventors: Yuping Xu, Xiamen (CN); Xiao Yang, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/103,755

(22) Filed: Jan. 31, 2023

(65) Prior Publication Data

US 2023/0178009 A1  Jun. 8, 2023

(30) Foreign Application Priority Data

Jun. 30, 2022 (CN) .......................... 202210771193.5

(51) Int. Cl.
G09G 3/32       (2016.01)
H10K 59/121     (2023.01)
H01L 27/12      (2006.01)
H01L 29/786     (2006.01)

(52) U.S. Cl.
CPC .......... *G09G 3/32* (2013.01); *H10K 59/1213* (2023.02); *H10K 59/1216* (2023.02); *G09G 2300/0426* (2013.01); *G09G 2300/0465* (2013.01); *G09G 2300/0819* (2013.01); *G09G 2300/0847* (2013.01); *G09G 2300/0861* (2013.01); *H01L 27/1225* (2013.01); *H01L 27/1251* (2013.01); *H01L 27/1255* (2013.01); *H01L 29/78648* (2013.01); *H01L 29/78675* (2013.01); *H01L 29/7869* (2013.01)

(58) Field of Classification Search
CPC ........................ G09G 3/3291; H10K 59/131
See application file for complete search history.

(56) References Cited

U.S. PATENT DOCUMENTS

2020/0226983 A1* 7/2020 Lee ...................... G09G 3/3291
2022/0165836 A1* 5/2022 Hong ................... H10K 59/131

* cited by examiner

*Primary Examiner* — Kevin M Nguyen
(74) *Attorney, Agent, or Firm* — KDW Firm PLLC

(57) ABSTRACT

Provided are a pixel driving circuit, a display panel, and a display device. Both a constant voltage signal line and a variable voltage signal line extend along a first direction. The constant voltage signal line includes an initialization voltage line, and the variable voltage signal line includes an initialization control signal line. A first electrode of an initialization transistor is electrically connected to the initialization voltage line, a second electrode of the initialization transistor is electrically connected to a first electrode or a second electrode of a drive transistor, and a gate of the initialization transistor is electrically connected to the initialization control signal line and used for turning on the initialization transistor according to a control signal on the initialization control signal line so as to initialize the first electrode or the second electrode of the drive transistor.

19 Claims, 22 Drawing Sheets

PIXEL DRIVING CIRCUIT, DISPLAY PANEL, AND DISPLAY DEVICE

CROSS-REFERENCE TO RELATED APPLICATION(S)

This application claims priority to Chinese Patent Application No. 202210771193.5 filed Jun. 30, 2022, the disclosure of which is incorporated herein by reference in its entirety.

TECHNICAL FIELD

The present disclosure relates to the field of display techniques and, in particular, to a pixel driving circuit, a display panel, and a display device.

BACKGROUND

With the development of science and technology, more and more display devices, such as mobile phones, tablet computers, laptops and smart wearable devices, are widely applied to people's daily life and work, bringing great convenience to people's daily life and work and becoming an essential important tool for people today. A display panel is a main component of the display device for implementing a display function.

In the display panel, a pixel driving circuit provides a displaying-required drive current for a light-emitting element of the display panel and controls whether the light-emitting element enters a light emission stage. Therefore, the pixel driving circuit is an indispensable element in most self-luminous display panels.

SUMMARY

The present disclosure provides a pixel driving circuit, a display panel, and a display device.

In a first aspect, an embodiment of the present disclosure provides a pixel driving transistor. The pixel driving transistor includes a drive transistor, an initialization transistor, multiple constant voltage signal lines, and multiple variable voltage signal lines, where voltage values on the constant voltage signal lines are constant values, and voltage values on the variable voltage signal lines vary with time. All the constant voltage signal lines and the variable voltage signal lines extend along a first direction.

The constant voltage signal lines include an initialization voltage line, and the variable voltage signal lines include an initialization control signal line.

A gate of the drive transistor is configured for writing a data signal, and a first electrode of the drive transistor is configured for writing a first power signal.

A first electrode of the initialization transistor is electrically connected to the initialization voltage line, a second electrode of the initialization transistor is electrically connected to the first electrode or the second electrode of the drive transistor, and a gate of the initialization transistor is electrically connected to the initialization control signal line and used for turning on the initialization transistor according to a control signal on the initialization control signal line so as to initialize the first electrode or the second electrode of the drive transistor.

Along a direction perpendicular to a plane of a substrate where the pixel driving circuit is located, the initialization voltage line at least partially overlaps with the variable voltage signal line, and/or the initialization control signal line at least partially overlaps with the constant voltage signal line.

In a second aspect, an embodiment of the present disclosure provides a display panel including a display region, where the display region includes a plurality of pixel driving circuits according to the first aspect and a plurality of light-emitting elements.

In a third aspect, an embodiment of the present disclosure provides a display device. The display device includes the display panel according to the second aspect.

DETAILED DESCRIPTION

Figure 1:
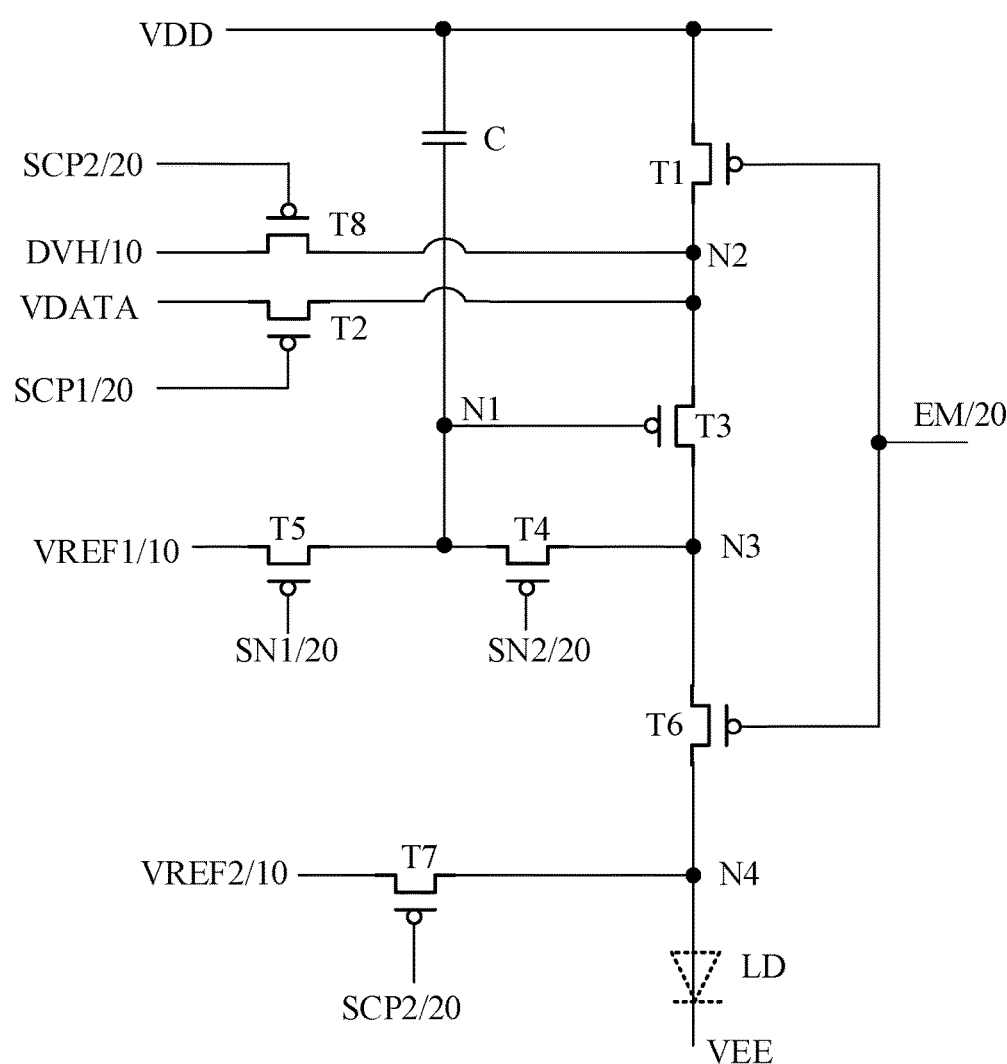
FIG. 1 is a circuit diagram of a pixel driving circuit according to an embodiment of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

Figure 2:
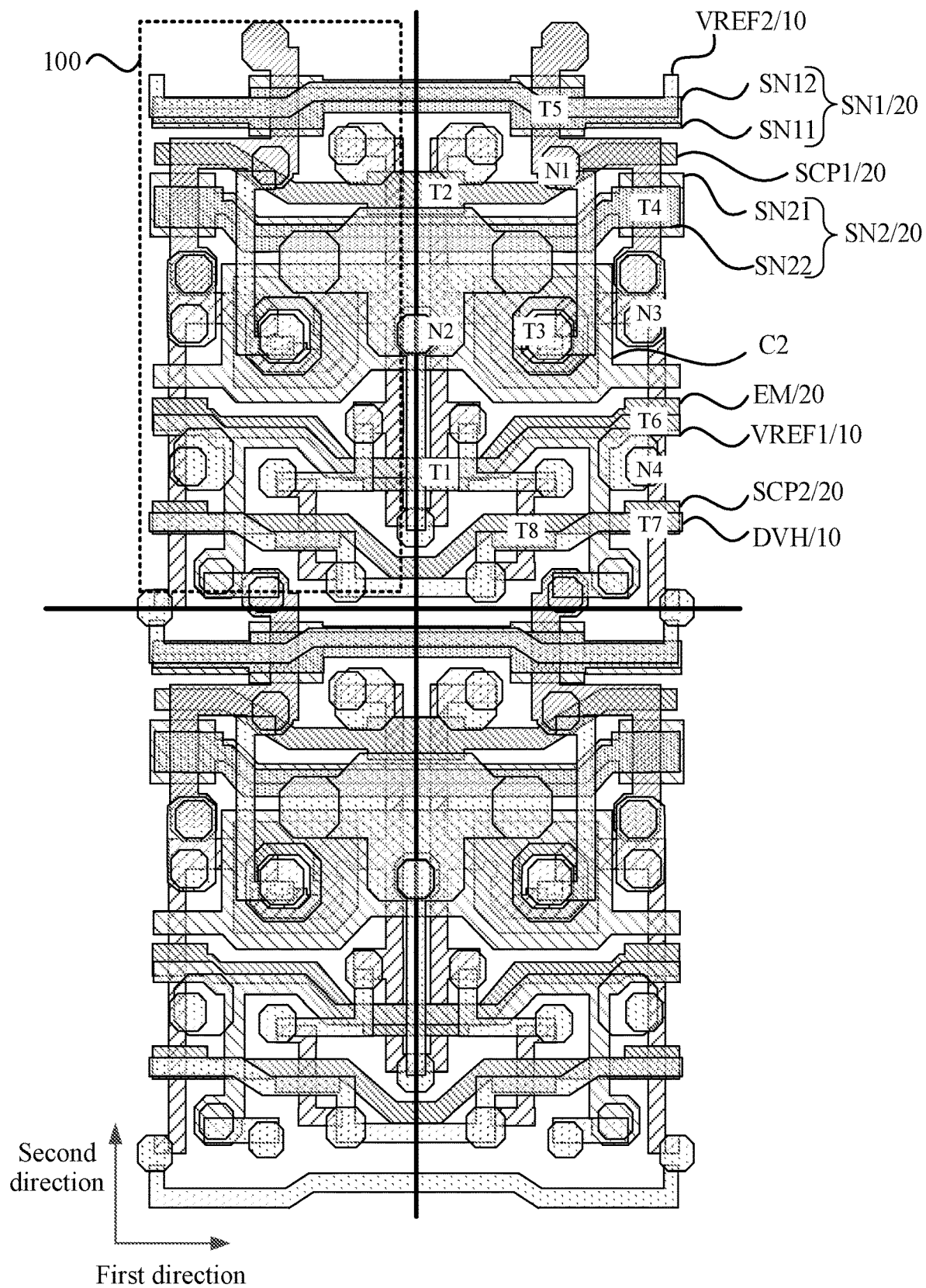
FIG. 2 is a top view of a pixel driving circuit according to an embodiment of the present disclosure.
Figure 3:
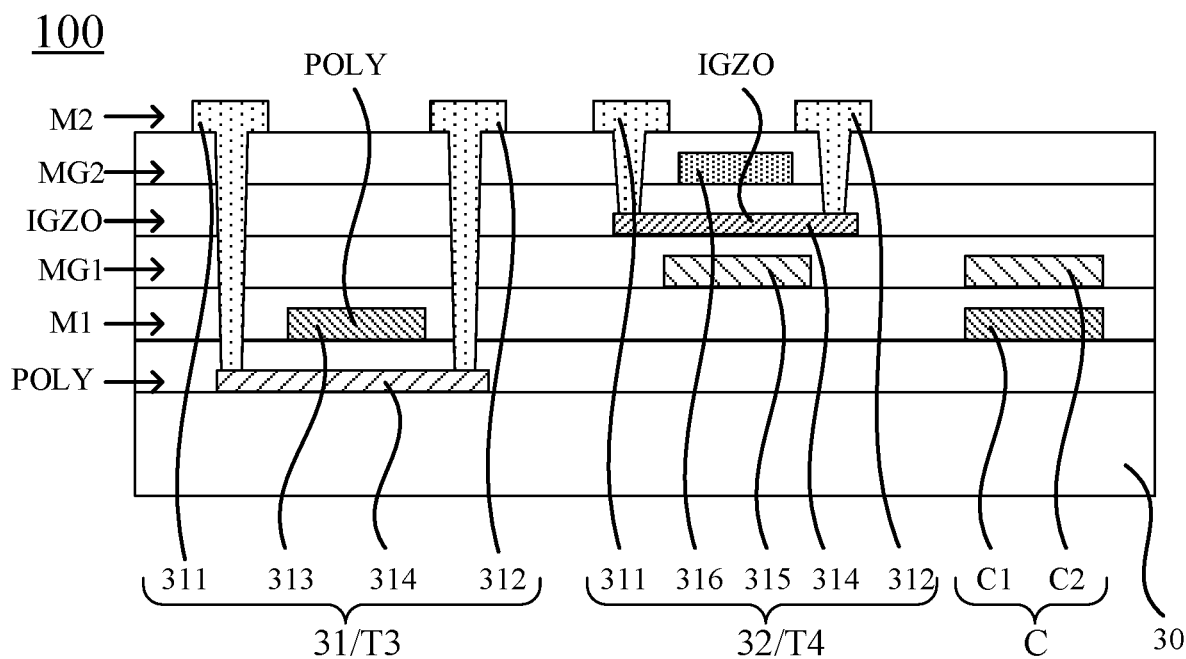
FIG. 3 is a sectional view of a pixel driving circuit according to an embodiment of the present disclosure.

FIG. 1 is a circuit diagram of a pixel driving circuit according to an embodiment of the present disclosure, FIG. 2 is a top view of a pixel driving circuit according to an embodiment of the present disclosure, and FIG. 3 is a sectional view of a pixel driving circuit according to an embodiment of the present disclosure. Referring to FIGS. 1 to 3, a pixel driving circuit 100 includes a drive transistor T3, an initialization transistor T8, multiple constant voltage signal lines 10, and multiple variable voltage signal lines 20. All the constant voltage signal lines 10 and the variable voltage signal lines 20 extend along a first direction. In the present disclosure, all the constant voltage signal lines 10 and the variable voltage signal lines 20 refer to signal lines extending along the first direction. Voltage values on the constant voltage signal lines 10 are constant values and do not vary with time, and voltages on the constant voltage signal lines 10 are direct current voltages. Voltage values on the variable voltage signal lines 20 vary with time. For example, in a period of time, the voltage value on the variable voltage signal line 20 is a first voltage, and in a second period of time, the voltage value on the variable voltage signal line 20 is a second voltage, where the first voltage is not equal to the second voltage. The voltages on the variable voltage signal lines 20 are alternating current voltages. The constant voltage signal lines 10 include an initialization voltage line DVH, and the variable voltage signal lines 20 include an initialization control signal line SCP2.

A gate of the drive transistor T3 is electrically connected to a first node N1 and used for writing a data signal. The data signal is provided by a data line VDATA. A first electrode of the drive transistor T3 is electrically connected to a second node N2 and used for writing a first power signal. The first power signal is provided by a first power line VDD.

A first electrode of the initialization transistor T8 is electrically connected to the initialization voltage line DVH, and a second electrode of the initialization transistor T8 is electrically connected to the first electrode or the second electrode of the drive transistor T3, that is, the second electrode of the initialization transistor T8 is electrically connected to the second node N2. A gate of the initialization transistor T8 is electrically connected to the initialization control signal line SCP2 and used for turning on the initialization transistor T8 according to a control signal on the initialization control signal line SCP2 so as to initialize the first electrode or the second electrode of the drive transistor T3 and reset the second node N2, thereby improving the brightness of the first frame and preventing the brightness of the first frame from being too low.

Along a direction perpendicular to a plane of a substrate where the pixel driving circuit 100 is located, that is, along a direction perpendicular to a plane where the substrate 30 is located, the initialization voltage line DVH at least partially overlaps with the variable voltage signal lines 20, and/or the initialization control signal line SCP2 at least partially overlaps with the constant voltage signal lines 10.

It is to be understood that if the variable voltage signal line 20 and the variable voltage signal line 20 overlap, the voltage on one variable voltage signal line 20 fluctuates, thereby affecting the voltage value on the other variable voltage signal line 20, easily causing a thin-film transistor to be turned on by mistake. Therefore, to avoid the thin-film transistor from being turned on by mistake, the variable voltage signal lines 20 and the constant voltage signal lines 10 may overlap.

It is to be understood that the variable voltage signal lines 20 and the constant voltage signal lines 10 that overlap are in different layers, and the variable voltage signal lines 20 and the constant voltage signal lines 10 that overlap are disposed in two different metal films, so as to avoid the electrical connection between the variable voltage signal lines 20 and the constant voltage signal lines 10. The initialization voltage line DVH and the variable voltage signal line 20 that at least partially overlap are in different layers, and the initialization control signal line SCP2 and the constant voltage signal line 10 that at least partially overlap are in different layers.

An embodiment of the present disclosure provides the pixel driving circuit, where the first electrode of the initialization transistor T8 is electrically connected to the initialization voltage line DVH, and the second electrode of the initialization transistor T8 is electrically connected to the second node N2. The gate of the initialization transistor T8 is electrically connected to the initialization control signal line SCP2. The initialization transistor T8 is configured for resetting the second node N2 so as to improve the brightness of the first frame, thereby preventing the brightness of the first frame from being too low. Along the direction perpendicular to the plane where the substrate 30 is located, the initialization voltage line DVH and the variable voltage signal line 20 at least partially overlap, and/or the initialization control signal line SCP2 and the constant voltage signal line 10 at least partially overlap. Therefore, along a second direction, a space occupied by the initialization voltage line DVH and a space occupied by the variable voltage signal line 20 overlap, and/or a space occupied by the initialization control signal line SCP2 and a space occupied by the constant voltage signal line 10 overlap, so as to reduce a length of the pixel driving circuit 100 along the second direction and reduce the area of the space occupied by the pixel driving circuit 100, thereby improving the pixel density (that is, PPI) of the display panel using the pixel driving circuit. The first direction intersects with the second direction.

By way of example, referring to FIG. 1, the pixel driving circuit 100 includes a power write transistor T1, a data write transistor T2, the drive transistor T3, a compensation transistor T4, a first reset transistor T5, a light emission control transistor T6, a second reset transistor T7, an initialization transistor T8, and a storage capacitor C. A first electrode of the power write transistor T1 is electrically connected to the first power line VDD, a second electrode of the power write transistor T1 is electrically connected to the second node N2, and a gate of the power write transistor T1 is electrically connected to a light emission control signal line EM. A first electrode of the data write transistor T2 is electrically connected to the data line VDATA, a second electrode of the data write transistor T2 is electrically connected to the second node N2, and a gate of the data write transistor T2 is electrically connected to a data write control signal line SCP1. The first electrode of the drive transistor T3 is electrically connected to the second node N2, the second electrode of the drive transistor T3 is electrically connected to a third node N3, and the gate of the drive transistor T3 is electrically connected to the first node N1. A first electrode of the compensation transistor T4 is electrically connected to the first node N1, a second electrode of the compensation transistor T4 is electrically connected to the third node N3, and a gate of the compensation transistor T4 is electrically connected to a second scanning line SN2. A first electrode of the first reset transistor T5 is electrically connected to a first reference voltage line VREF1, a second electrode of the first reset transistor T5 is electrically connected to the first node N1, and a gate of the first reset transistor T5 is electrically connected to a first scanning line SN1. A first electrode of the light emission control transistor T6 is electrically connected to the third node N3, a second electrode of the light emission control transistor T6 is electrically connected to a fourth node N4, and a gate of the light emission control transistor T6 is electrically connected to the light emission control signal line EM. A first electrode of the second reset transistor T7 is electrically connected to a second reference voltage line VREF2, a second electrode of the second reset transistor T7 is electrically connected to the fourth node N4, and a gate of the second reset transistor T7 is electrically connected to an initialization control signal line SCP2. A first electrode of the initialization transistor T8 is electrically connected to the initialization voltage line DVH, a second electrode of the initialization transistor T8 is electrically connected to the second node N2, and a gate of the initialization transistor T8 is electrically connected to the initialization control signal line SCP2. A first plate C1 of the storage capacitor C is electrically connected to the first node N1, and a second plate C2 of the storage capacitor C is electrically connected to the first power line VDD.

The first node N1, the second node N2, the third node N3, and the fourth node N4 may be virtually existing connection nodes or may be actually existing connection nodes.

It is to be noted that the circuit diagram shown in FIG. 1 is only an example and is not a limitation of the present disclosure. In other embodiments, the pixel driving circuit 100 with other circuit structures may also be provided. For example, in an embodiment, the pixel driving circuit 100 does not include the compensation transistor T4.

By way of example, referring to FIGS. 1 and 2, the constant voltage signal lines 10 include the initialization voltage line DVH, the first reference voltage line VREF1, and the second reference voltage line VREF2. The variable voltage signal lines 20 include the initialization control signal line SCP2, the data write control signal line SCP1, the first scanning line SN1, the second scanning line SN2, and the light emission control signal line EM.

By way of example, referring to FIG. 3, the pixel driving circuit 100 includes the substrate 30 and multiple metal films on the substrate 30. The multiple metal films include a first metal layer M1, a first sub-gate metal layer MG1, a second sub-gate metal layer MG2, and a second metal layer M2 that are stacked in sequence. The first metal layer M1 is disposed between the substrate 30 and the first sub-gate metal layer MG1. The pixel driving circuit 100 may further include a silicon semiconductor layer POLY and an oxide semiconductor layer IGZO. The silicon semiconductor layer POLY is disposed between the substrate 30 and the first metal layer M1. The oxide semiconductor layer IGZO is disposed between the first sub-gate metal layer MG1 and the second sub-gate metal layer MG2. The silicon semiconductor layer POLY includes silicon. The oxide semiconductor layer IGZO includes an oxide. Generally, the oxide semiconductor layer IGZO includes a metal oxide. In other embodiments, the silicon semiconductor layer POLY is disposed on one side of the first metal layer M1 facing away from the substrate 30.

By way of example, referring to FIG. 3, the pixel driving circuit 100 includes multiple thin-film transistors, and the multiple thin-film transistors include silicon transistors 31 and oxide transistors 32. That is, part of the thin-film transistors in the pixel driving circuit 100 are the silicon transistors 31, and the other part of the thin-film transistors in the pixel driving circuit 100 are the oxide transistors 32. The silicon transistor 31 includes a source 311, a drain 312, a gate 313, and a semiconductor layer 314. The semiconductor layer 314 of the silicon transistor 31 is disposed in the silicon semiconductor layer POLY, that is, the semiconductor layer 314 of the silicon transistor 31 is formed using the material in the silicon semiconductor layer POLY so that the semiconductor layer 314 of the silicon transistor 31 includes silicon. The gate 313 of the silicon transistor 31 is disposed in the first metal layer M1, that is, the gate 313 of the silicon transistor 31 is formed using the material in the first metal layer M1. The source 311 of the silicon transistor 31 and the drain 312 of the silicon transistor 31 are both disposed in the second metal layer M2, that is, the source 311 of the silicon transistor 31 and the drain 312 of the silicon transistor 31 are formed using the material in the second metal layer M2. The oxide transistor 32 includes a source 311, a drain 312, a first sub-gate 315, a second sub-gate 316, and a semiconductor layer 314. The semiconductor layer 314 of the oxide transistor 32 is disposed in the oxide semiconductor layer IGZO, that is, the semiconductor layer 314 of the oxide transistor 32 is formed using the material in the oxide semiconductor layer IGZO. The first sub-gate 315 is disposed in the first sub-gate metal layer MG1, that is, the first sub-gate 315 is formed using the material in the first sub-gate metal layer MG1. The second sub-gate 316 is disposed in the second sub-gate metal layer MG2, that is, the second sub-gate 316 is formed using the material in the second sub-gate metal layer MG2. The source 311 of the oxide transistor 32 and the drain 312 of the oxide transistor 32 are both disposed in the second metal layer M2, that is, the source 311 of the oxide transistor 32 and the drain 312 of the oxide transistor 32 are formed using the material in the second metal layer M2. The first plate C1 of the storage capacitor C is disposed in the first metal layer M1, and the second plate C2 of the storage capacitor C is disposed in the first sub-gate metal layer MG1.

By way of example, referring to FIGS. 1 and 3, the power write transistor T1, the data write transistor T2, the drive transistor T3, the light emission control transistor T6, the second reset transistor T7, and the initialization transistor T8 are the silicon transistors 31. The compensation transistor T4 and the first reset transistor T5 are the oxide transistors 32. Since the compensation transistor T4 and the first reset transistor T5 are both connected to the first node N1, the compensation transistor T4 and the first reset transistor T5 are configured to be the oxide transistors 32 so as to reduce the leakage current to the first node N1.

In the field of display techniques, films are stacked so as to implement devices such as the thin-film transistors and storage capacitors in the pixel driving circuit 100. For the sake of clarity, in the embodiments of the present disclosure, the pixel driving circuit shown in FIG. 2 is further divided and described according to films.

Figure 4:
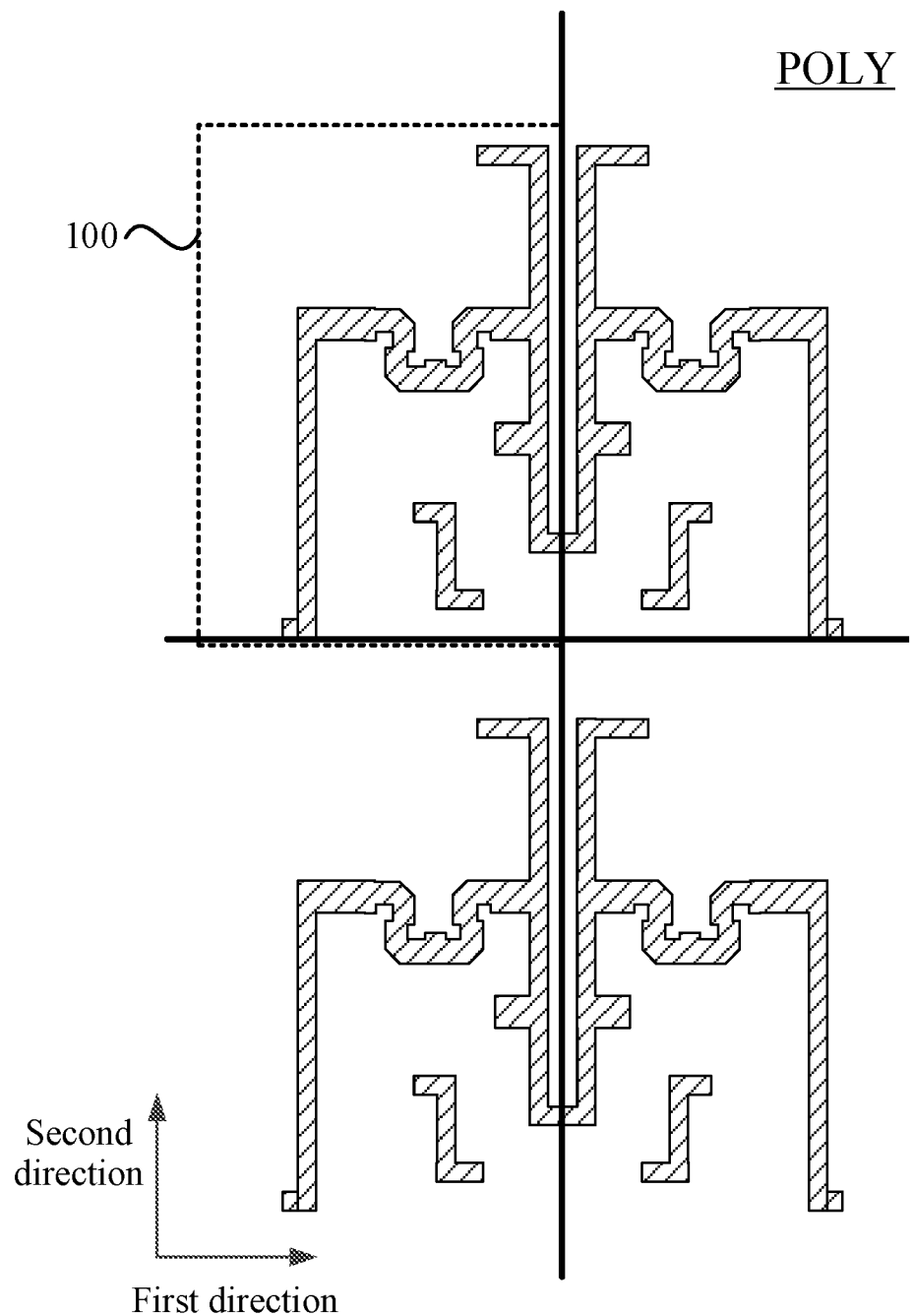
FIG. 4 is a top view of a silicon semiconductor layer according to an embodiment of the present disclosure.
Figure 5:
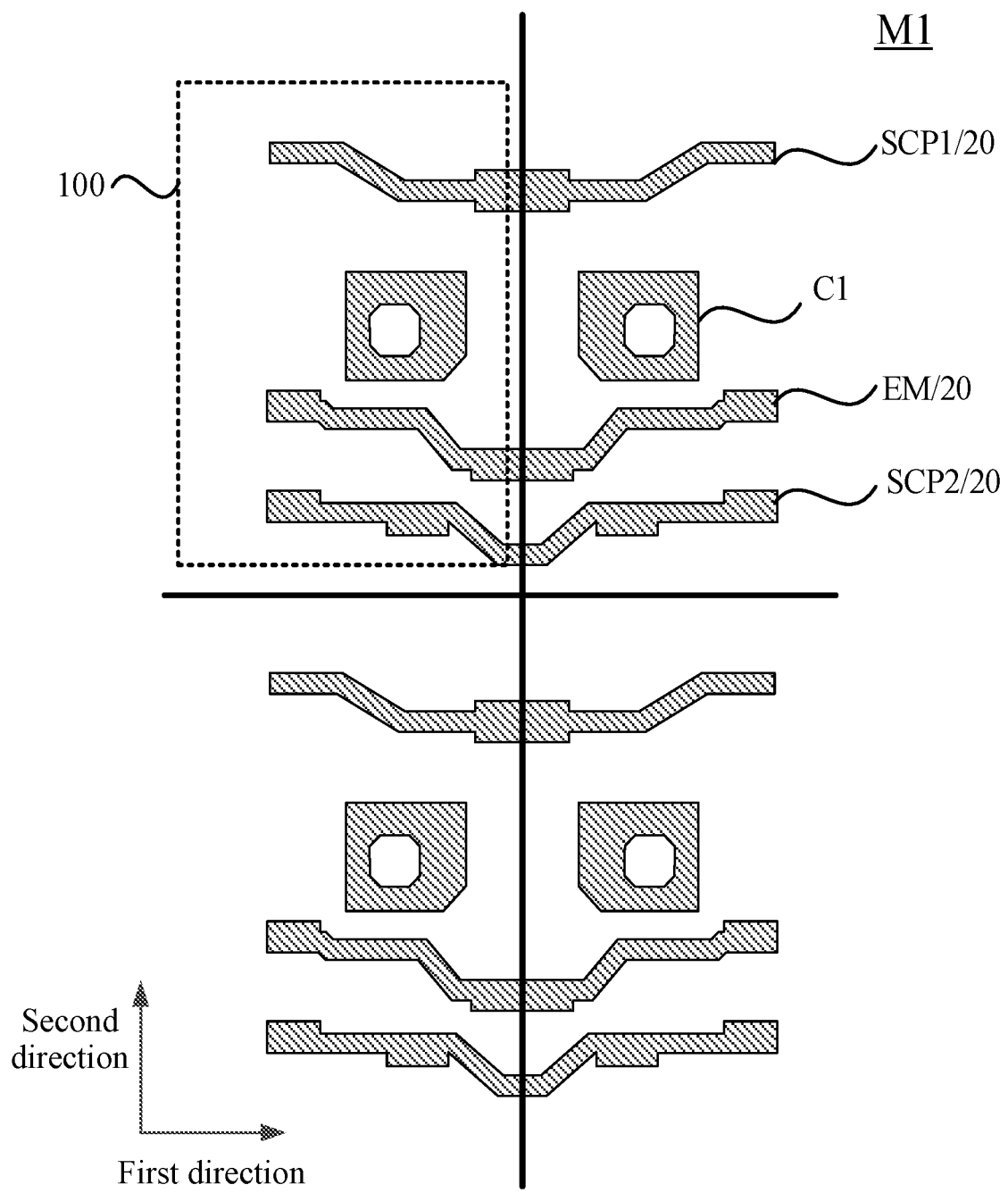
FIG. 5 is a top view of a first metal layer according to an embodiment of the present disclosure.
Figure 6:
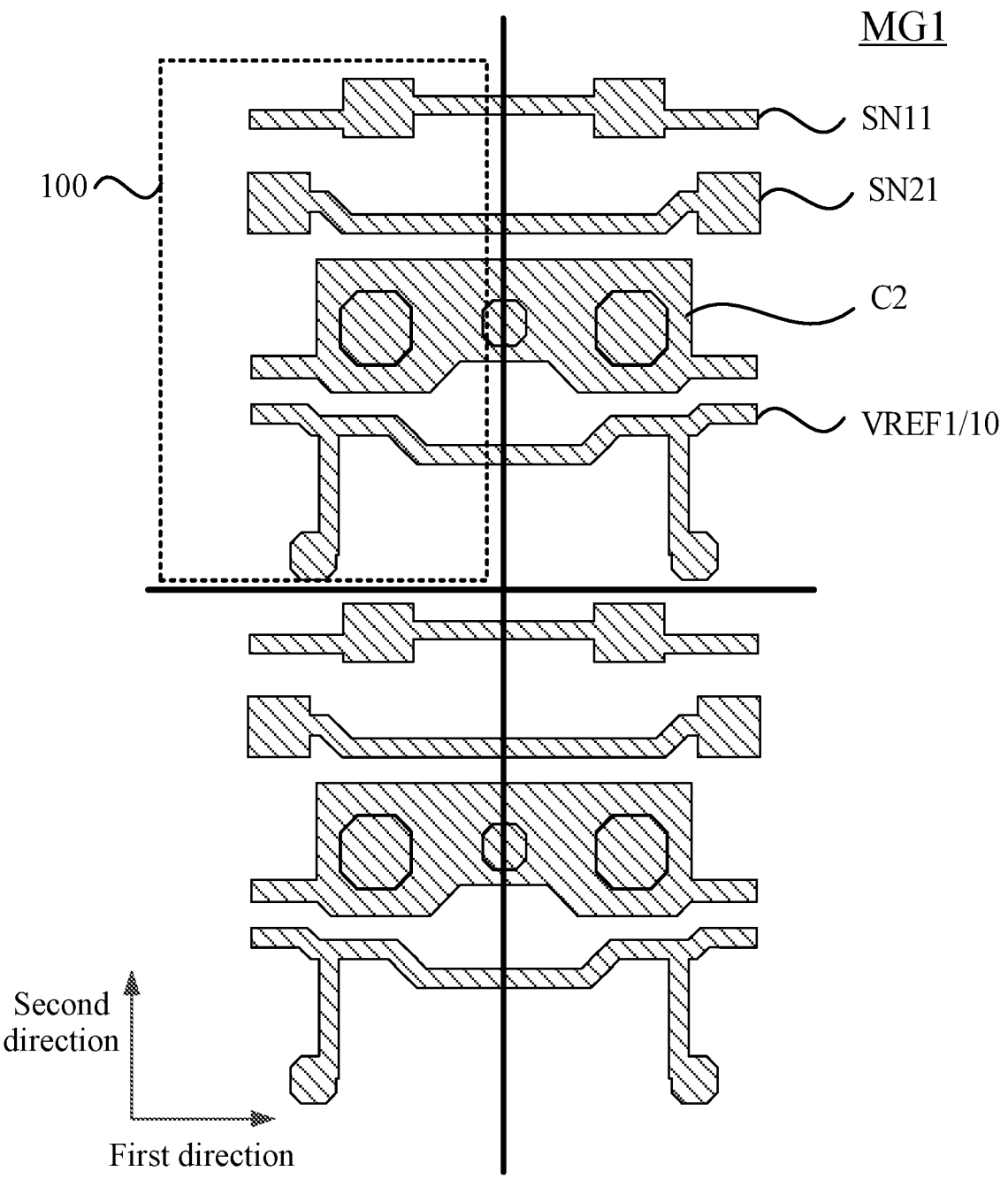
FIG. 6 is a top view of a first sub-gate metal layer according to an embodiment of the present disclosure.
Figure 7:
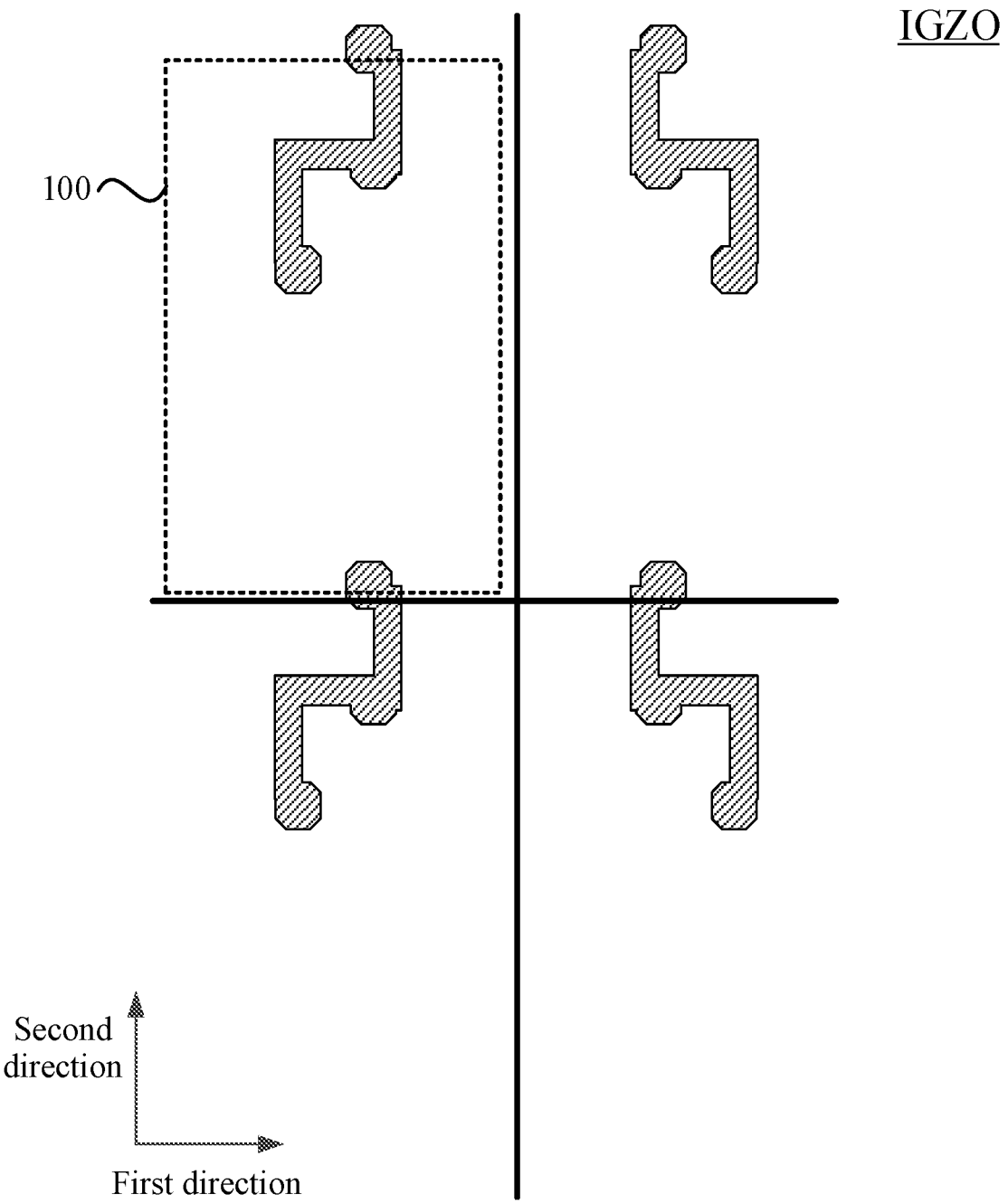
FIG. 7 is a top view of an oxide semiconductor layer according to an embodiment of the present disclosure.
Figure 8:
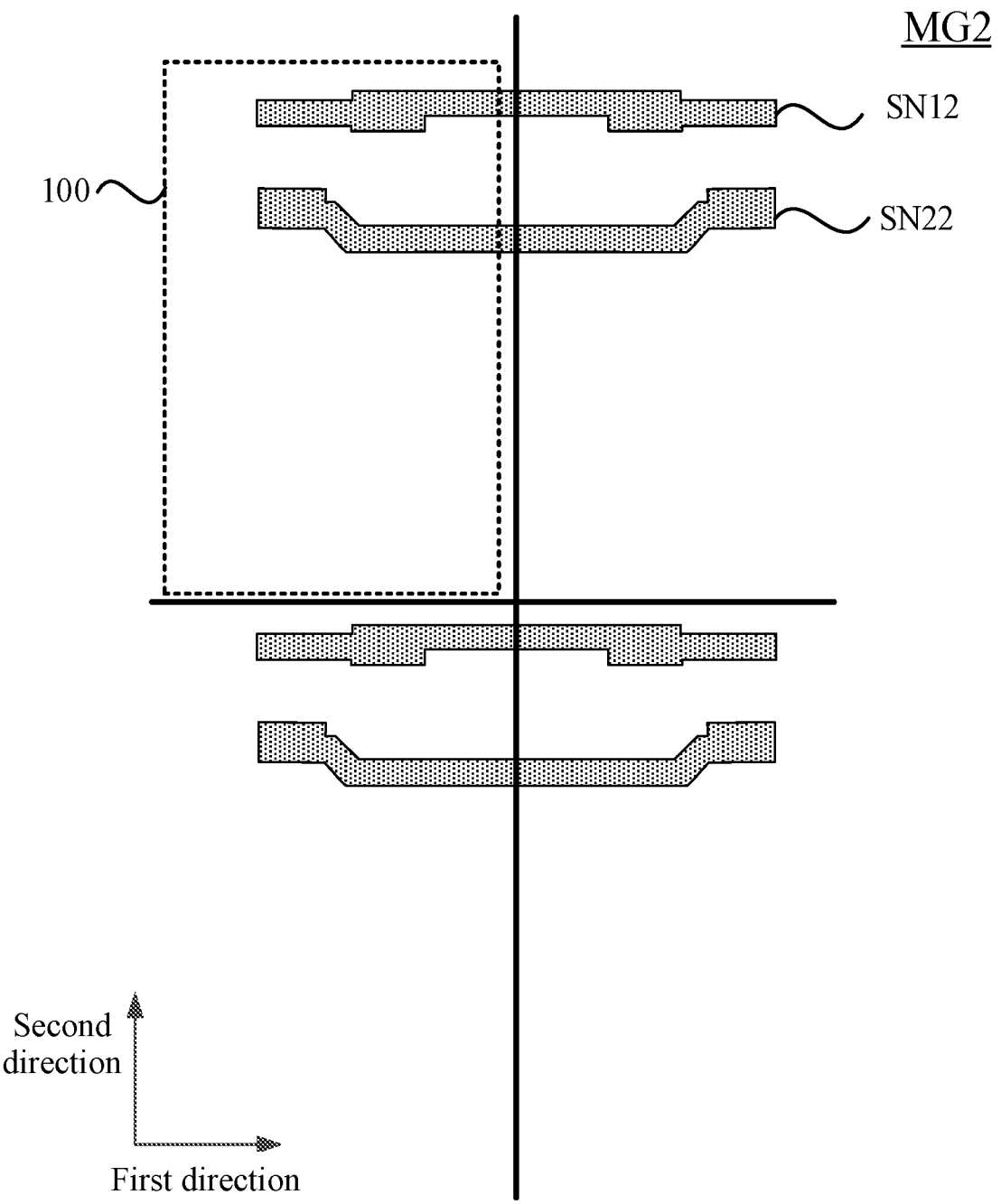
FIG. 8 is a top view of a second sub-gate metal layer according to an embodiment of the present disclosure.
Figure 9:
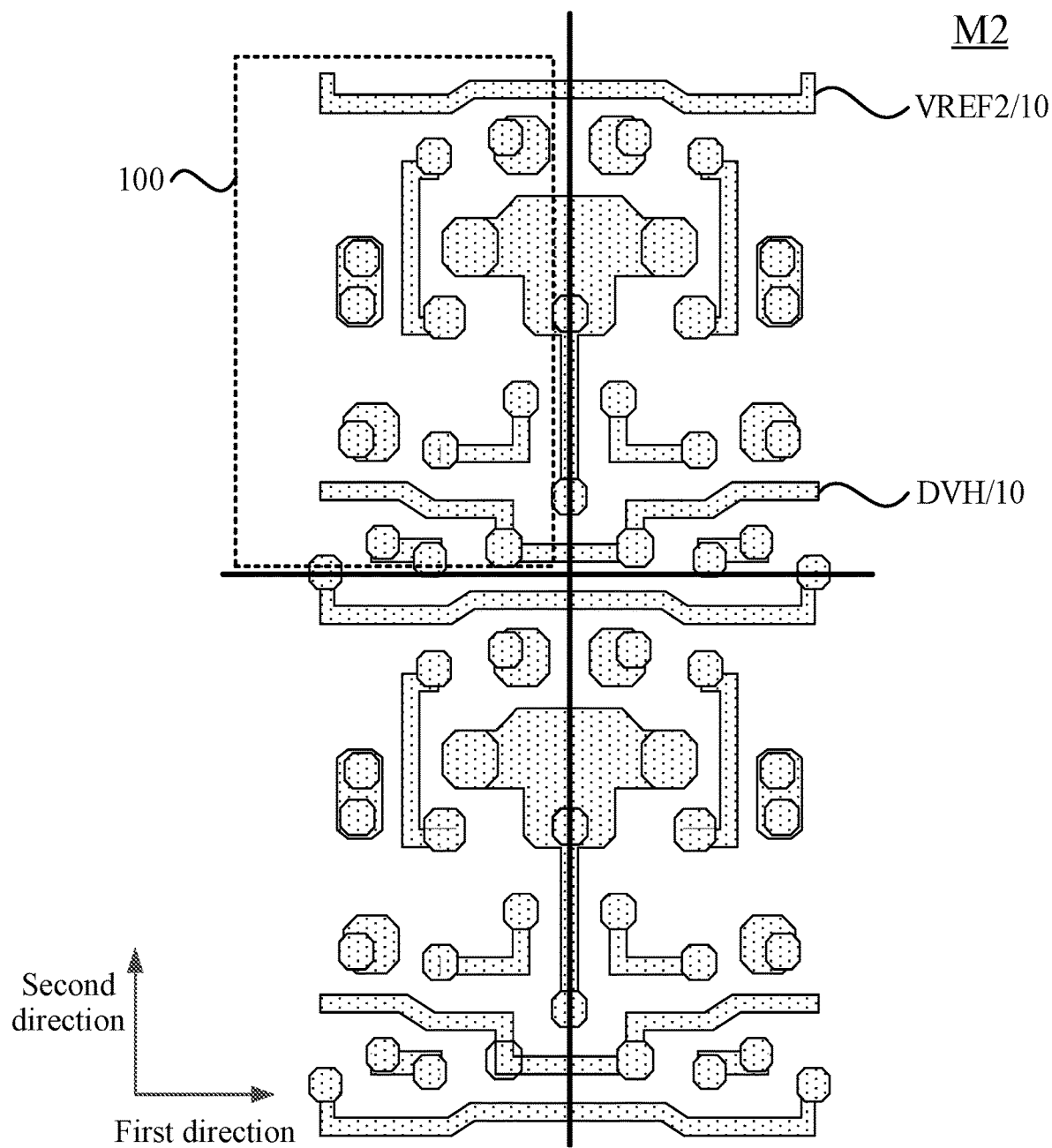
FIG. 9 is a top view of a second metal layer according to an embodiment of the present disclosure.

FIG. 4 is a top view of a silicon semiconductor layer according to an embodiment of the present disclosure, FIG. 5 is a top view of a first metal layer according to an embodiment of the present disclosure, FIG. 6 is a top view of a first sub-gate metal layer according to an embodiment of the present disclosure, FIG. 7 is a top view of an oxide semiconductor layer according to an embodiment of the present disclosure, FIG. 8 is a top view of a second sub-gate metal layer according to an embodiment of the present disclosure, and FIG. 9 is a top view of a second metal layer according to an embodiment of the present disclosure. Four pixel driving circuits 100 are illustrated in FIGS. 4 to 9. Referring to FIG. 2 and FIGS. 4 to 9, the first scanning line SN1 includes a first sub-scanning line SN11 and a second sub-scanning line SN12. The second scanning line SN2 includes a third sub-scanning line SN21 and a fourth sub-scanning line SN22. The data write control signal line SCP1, the light emission control signal line EM, and the initialization control signal line SCP2 are all disposed in the first metal layer M1, that is, the data write control signal line SCP1, the light emission control signal line EM, and the initialization control signal line SCP2 are formed using the material in the first metal layer M1. The first sub-scanning line SN11, the third sub-scanning line SN21, and the first reference voltage line VREF1 are all disposed in the first sub-gate metal layer MG1, that is, the first sub-scanning line SN11, the third sub-scanning line SN21, and the first reference voltage line VREF1 are formed using the material in the first sub-gate metal layer MG1. The second sub-scanning line SN12 and the fourth sub-scanning line SN22 are both disposed in the second sub-gate metal layer MG2, that is, the second sub-scanning line SN12 and the fourth sub-scanning line SN22 are formed using the material in the second sub-gate metal layer MG2. The initialization voltage line DVH and the second reference voltage line VREF2 are both disposed in the second metal layer M2, that is, the initialization voltage line DVH and the second reference voltage line VREF2 are formed using the material in the second metal layer M2.

For the sake of clarity, in the embodiments of the present disclosure, the pixel driving circuit shown in FIG. 2 is further divided and described according to different paths. It is to be understood that the semiconductor layer 314 of the thin-film transistor is formed at a position where the silicon semiconductor layer POLY and the oxide semiconductor layer IGZO overlap with the variable voltage signal line 20 that is relatively close to the POLY and IGZO. Parts of the silicon semiconductor layer POLY and the oxide semiconductor layer IGZO where the semiconductor layer 314 is not formed are used as wires which, for example, may connect two thin-film transistors. To simplify the description, structures in films (including the metal films and non-metal films) are referred to by the films. For example, a connection line disposed in the second metal layer M2 is referred to by the second metal layer M2.

Figure 10:
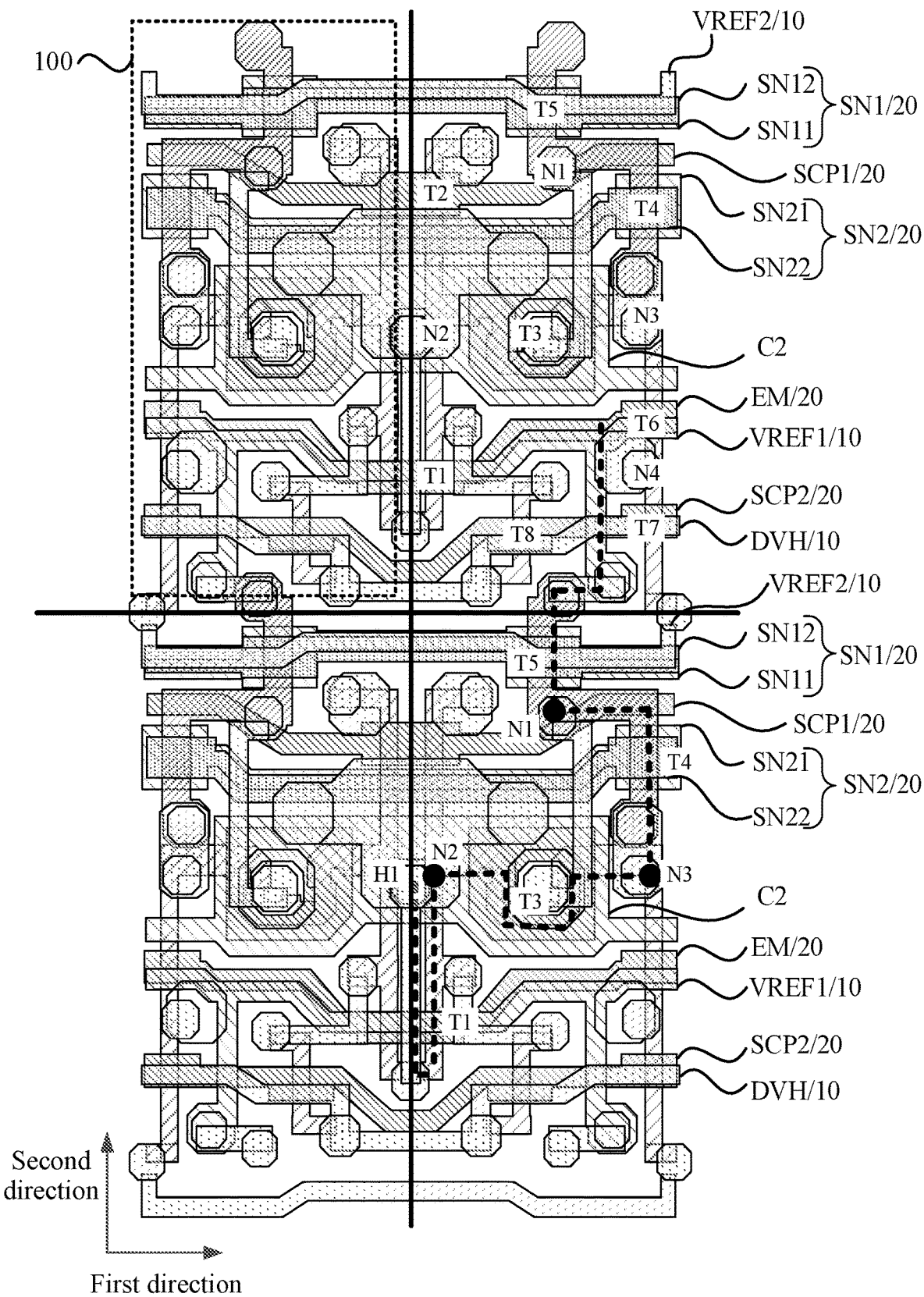
FIG. 10 is a top view of another pixel driving circuit according to an embodiment of the present disclosure.

FIG. 10 is a top view of another pixel driving circuit according to an embodiment of the present disclosure. Along a path marked by a dotted line in FIG. 10, referring to FIG. 1 and FIGS. 4 to 10, the first reference voltage line VREF1 disposed in the first sub-gate metal layer MG1 is connected to the first sub-gate metal layer MG1, the first sub-gate metal layer MG1 extends along an opposite direction of the second direction, at vias, the layer is changed from the first sub-gate metal layer MG1 to the second metal layer M2 and then from the second metal layer M2 to the oxide semiconductor layer IGZO, and the first reset transistor T5 is formed at a position where the oxide semiconductor layer IGZO overlaps with the first scanning line SN1 (including the first sub-scanning line SN11 and the second sub-scanning line SN12). The first reset transistor T5 is the oxide transistor 32, the first sub-gate 315 of the first reset transistor T5 is electrically connected to the first sub-scanning line SN11, and the second sub-gate 316 of the first reset transistor T5 is electrically connected to the second sub-scanning line SN12. Along the opposite direction of the second direction, the oxide semiconductor layer IGZO continues to extend to the first node N1. The oxide semiconductor layer IGZO continues to extend from the first node N1, and the compensation transistor T4 is formed at a position where the oxide semiconductor layer IGZO and the second scanning line SN2 (including the third sub-scanning line SN21 overlaps with the fourth sub-scanning line SN22). The compensation transistor T4 is the oxide transistor 32, the first sub-gate 315 of the compensation transistor T4 is electrically connected to the third sub-scanning line SN21, and the second sub-gate 316 of the compensation transistor T4 is electrically connected to the fourth sub-scanning line SN22. The oxide semiconductor layer IGZO continues to extend to the third node N3. At the third node N3, the layer is changed from the oxide semiconductor layer IGZO to the second metal layer M2 and then from the second metal layer M2 to the silicon semiconductor layer POLY. The silicon semiconductor layer POLY extends along an opposite direction of the first direction, so as to form the drive transistor T3. The silicon semiconductor layer POLY continues to extend to the second node N2 along the opposite direction of the first direction. At the second node N2, the silicon semiconductor layer POLY extends along the opposite direction of the second direction, so as to form the power write transistor T1 at a position where the silicon semiconductor layer POLY overlaps with the light emission control signal line EM. The silicon semiconductor layer POLY continues to extend and is changed to the second metal layer M2 at the via, and the second metal layer M2 extends to a first via H1. At the first via H1, the second metal layer M2 is changed to another layer and connected to the second plate C2 disposed in the first sub-gate metal layer MG1.

Figure 11:
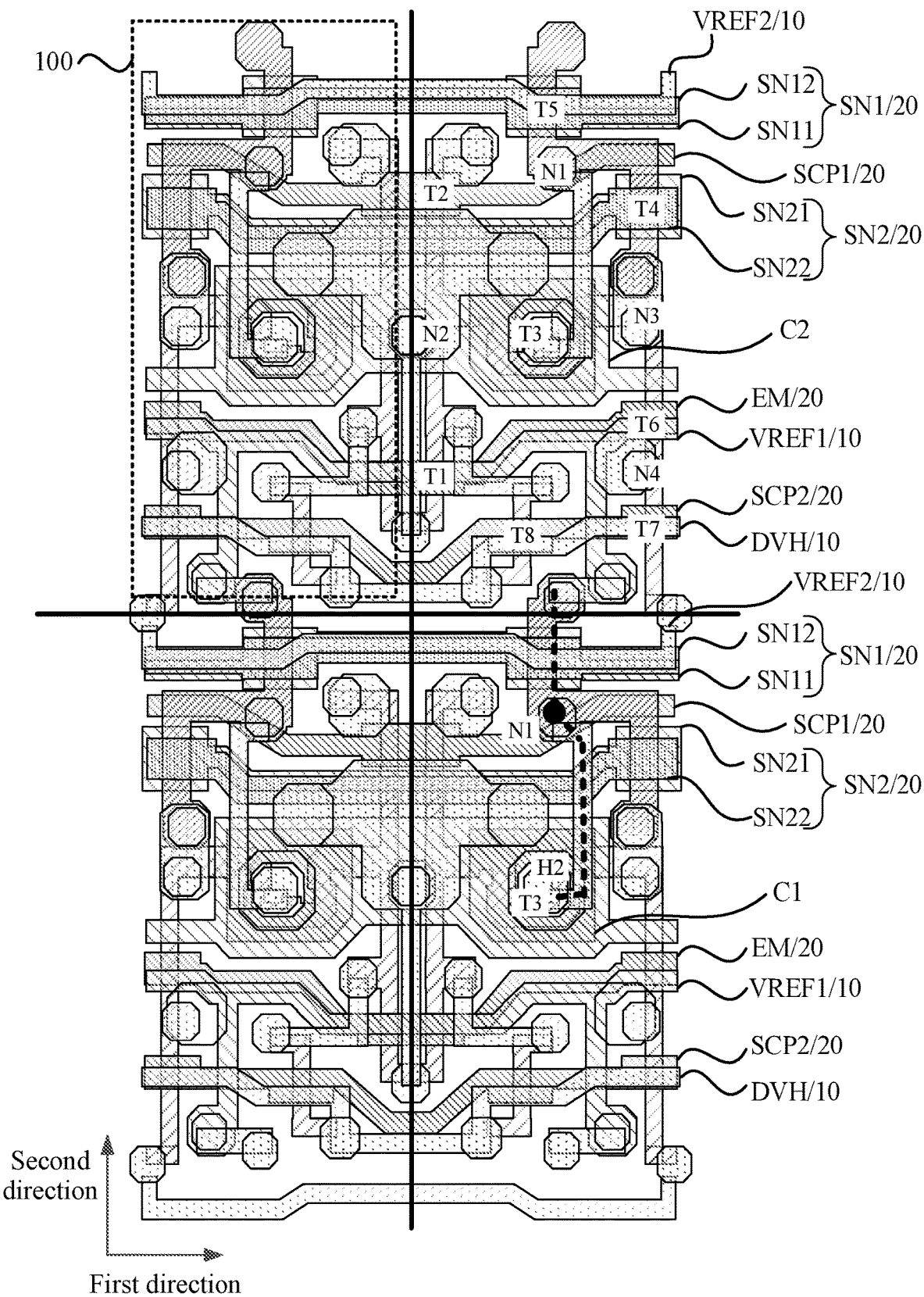
FIG. 11 is a top view of another pixel driving circuit according to an embodiment of the present disclosure.

FIG. 11 is a top view of another pixel driving circuit according to an embodiment of the present disclosure. Along a path marked by a dotted line in FIG. 11, referring to FIG. 1, FIGS. 4 to 9, and FIG. 11, at the first node N1, the layer is changed from the oxide semiconductor layer IGZO to the second metal layer M2, and the second metal layer M2 extends to a second via H2 along the opposite direction of the second direction. At the second via H2, the second metal layer M2 is changed to another layer and connected to the first plate C1 disposed in the first metal layer M1. On the one hand, the first plate C1 is used as a lower plate of the storage capacitor C, and the first plate C1 is opposite to the second plate C2, so as to form the storage capacitor C. On the other hand, the first plate C1 is used as the gate of the drive transistor T3.

Figure 12:
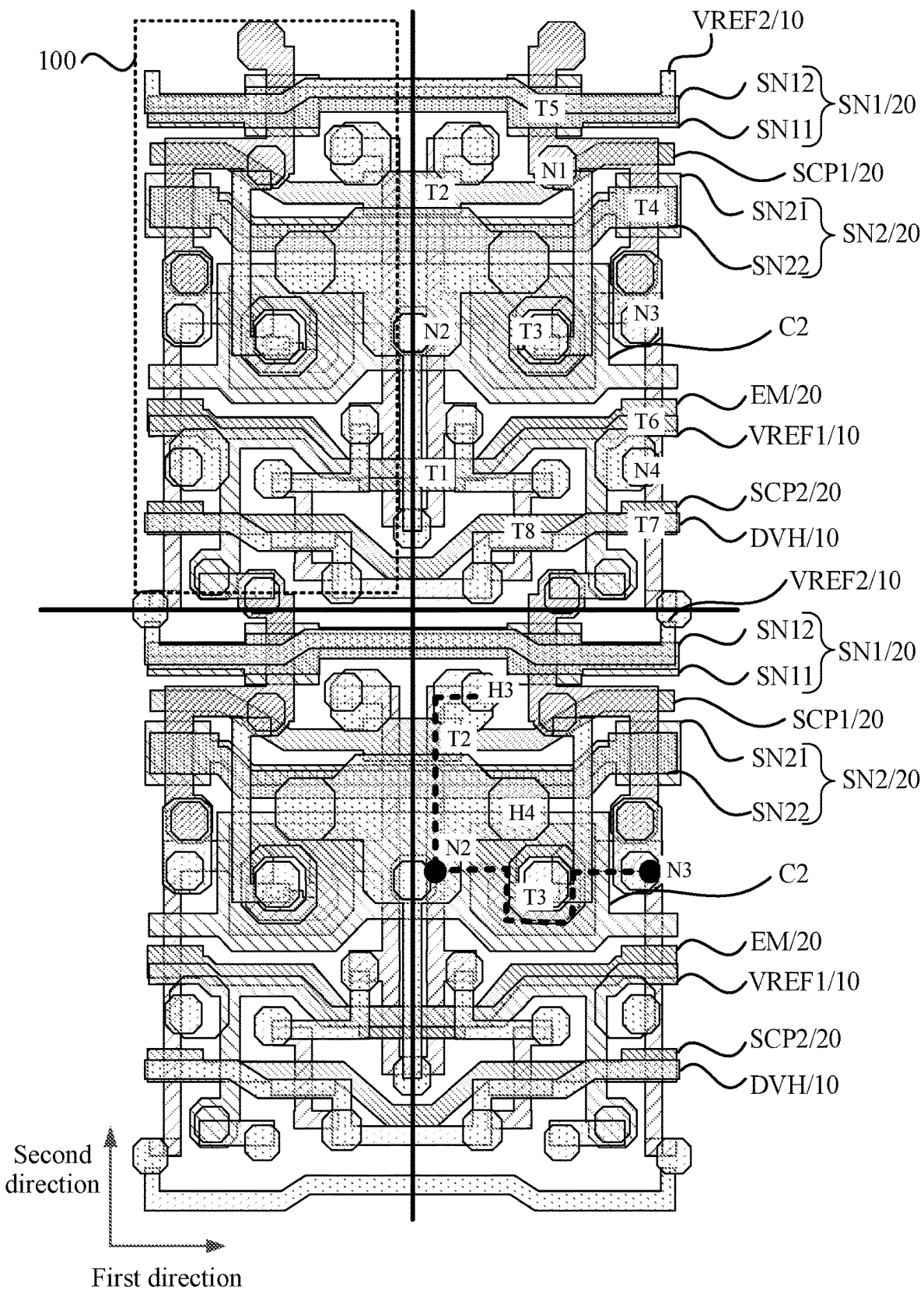
FIG. 12 is a top view of another pixel driving circuit according to an embodiment of the present disclosure.

FIG. 12 is a top view of another pixel driving circuit according to an embodiment of the present disclosure. Along a path marked by a dotted line in FIG. 12, referring to FIG. 1, FIGS. 4 to 9, and FIG. 12, at the second node N2, the silicon semiconductor layer POLY extends along the second direction, and the data write transistor T2 is formed at a position where the silicon semiconductor layer POLY and the data write control signal line SCP1 overlap. The silicon semiconductor layer POLY continues to extend to a third via H3 and is changed to the second metal layer M2 at the third via H3.

Figure 13:
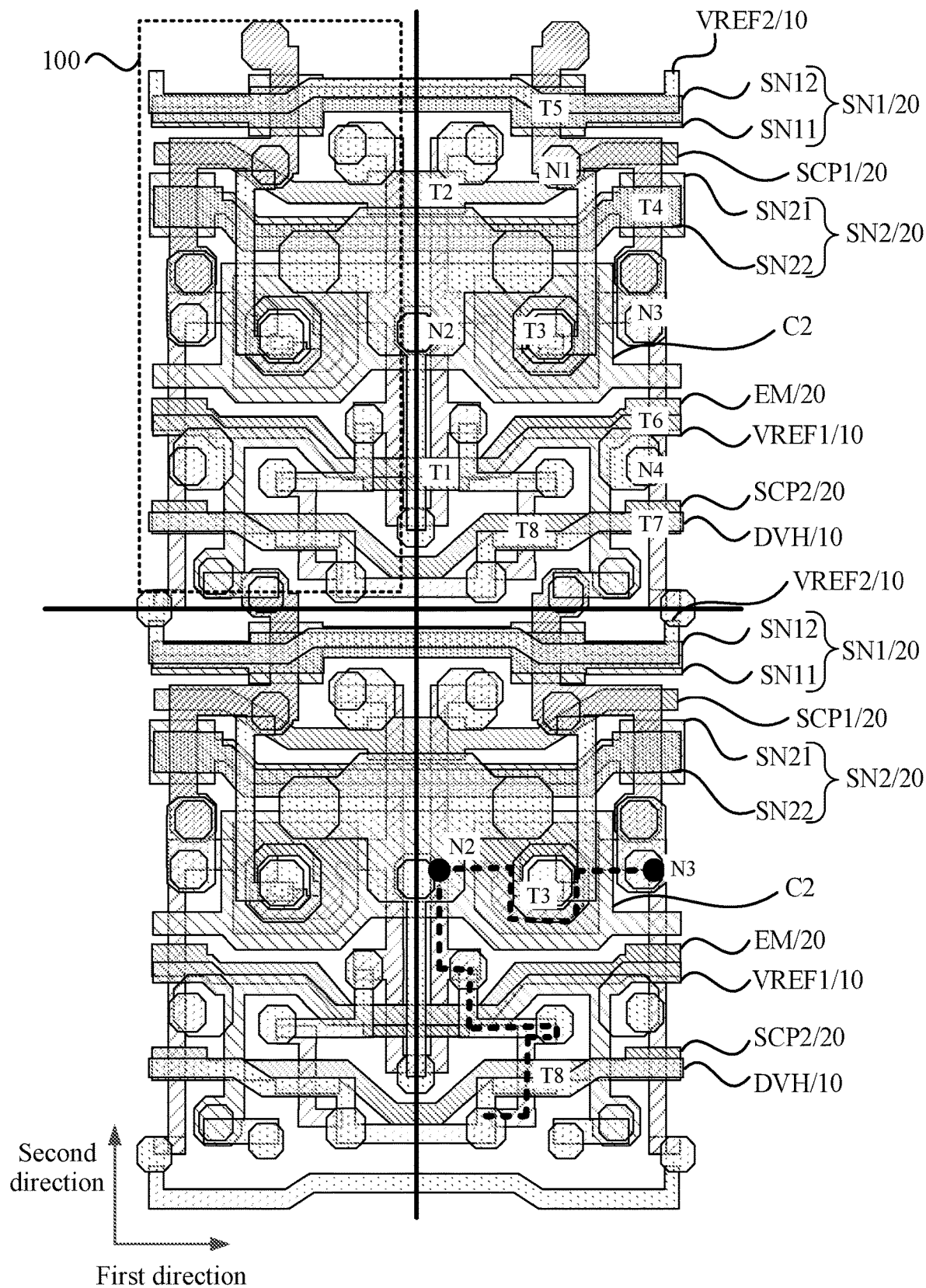
FIG. 13 is a top view of another pixel driving circuit according to an embodiment of the present disclosure.

FIG. 13 is a top view of another pixel driving circuit according to an embodiment of the present disclosure. Along a path marked by a dotted line in FIG. 13, referring to FIGS. 1, FIGS. 4 to 9, and FIG. 13, at the second node N2, the silicon semiconductor layer POLY extends along the opposite direction of the second direction, at the via, the layer is changed from the silicon semiconductor layer POLY to the second metal layer M2, and after the light emission control signal line EM is crossed along the second metal layer M2, the layer is changed from the second metal layer M2 to the silicon semiconductor layer POLY. The initialization transistor T8 is formed at a position where the silicon semiconductor layer POLY and the initialization control signal line SCP2 overlap. The silicon semiconductor layer POLY continues to extend, and at the via, the silicon semiconductor layer POLY is changed to another layer and connected to the initialization voltage line DVH disposed in the second metal layer M2.

Figure 14:
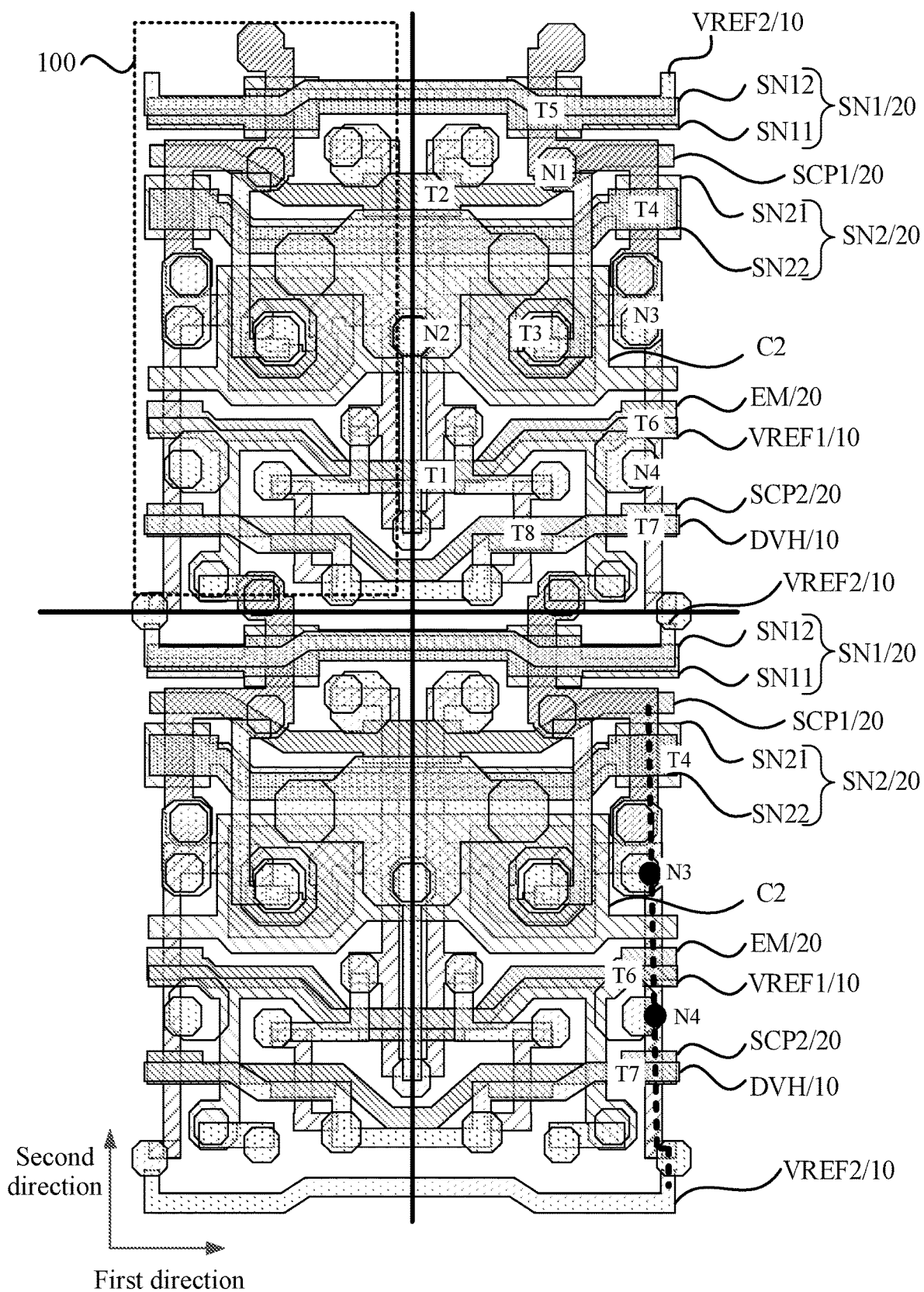
FIG. 14 is a top view of another pixel driving circuit according to an embodiment of the present disclosure.

FIG. 14 is a top view of another pixel driving circuit according to an embodiment of the present disclosure. Along a path marked by a dotted line in FIG. 14, referring to FIG. 1, FIGS. 4 to 9, and FIG. 14, at the third node N3, the layer is changed from the second metal layer M2 to the silicon semiconductor layer POLY, and the silicon semiconductor layer POLY extends along the opposite direction of the second direction, so as to form the light emission control transistor T6 at a position where the silicon semiconductor layer POLY and the light emission control signal line EM overlap. The silicon semiconductor layer POLY continues to extend to the fourth node N4. The silicon semiconductor layer POLY extends along the opposite direction of the second direction, so as to form the second reset transistor T7 at a position where the silicon semiconductor layer POLY overlaps with the initialization control signal line SCP2. The silicon semiconductor layer POLY continues to extend along the opposite direction of the second direction, and at the via, the silicon semiconductor layer POLY is changed to another layer and connected to the second reference voltage line VREF2 disposed in the second metal layer M2.

Optionally, referring to FIG. 2, along the direction perpendicular to the plane of the substrate where the pixel driving circuit 100 is located, the initialization control signal line SCP2 and the initialization voltage line DVH at least partially overlap. The initialization voltage line DVH is the constant voltage signal line 10, the initialization control signal line SCP2 is the variable voltage signal line 20, the initialization control signal line SCP2 and the initialization voltage line DVH at least partially overlap, and the voltage on the initialization voltage line DVH does not fluctuate, thereby not affecting the voltage on the initialization control signal line SCP2 and not causing the thin-film transistors (specifically, the second reset transistor T7 and the initialization transistor T8) connected to the initialization control signal line SCP2 to be turned on by mistake. The initialization control signal line SCP2 and the initialization voltage line DVH at least partially overlap so that along the second direction, a space occupied by the initialization control signal line SCP2 and a space occupied by the initialization voltage line DVH overlap, thereby reducing the length of the pixel driving circuit 100 along the second direction and reducing the area of the space occupied by the pixel driving circuit 100. Further, the gate of the initialization transistor T8 is electrically connected to the initialization control signal line SCP2, the first electrode of the initialization transistor T8 is electrically connected to the initialization voltage line DVH, the initialization control signal line SCP2 and the initialization voltage line DVH at least partially overlap, and a distance between the initialization control signal line SCP2 and the initialization voltage line DVH along the second direction is relatively small, so as to facilitate the connection between the initialization transistor T8 and the initialization control signal line SCP2 and the initialization voltage line DVH, thereby reducing a length of a connection line between the initialization transistor T8 and the initialization voltage line DVH.

On the basis that the initialization voltage line DVH and the variable voltage signal line 20 at least partially overlap and/or the initialization control signal line SCP2 and the constant voltage signal line 10 at least partially overlap, the present disclosure further exemplarily provides some other embodiments in which the constant voltage signal line 10 and the variable voltage signal line 20 overlap.

Optionally, referring to FIG. 2, along the direction perpendicular to the plane of the substrate where the pixel driving circuit 100 is located, the first reference voltage line VREF1 and the light emission control signal line EM at least partially overlap. The first reference voltage line VREF1 is the constant voltage signal line 10, the light emission control signal line EM is the variable voltage signal line 20, the first reference voltage line VREF1 and the light emission control signal line EM at least partially overlap, and the voltage on the first reference voltage line VREF1 does not fluctuate, thereby not affecting the voltage on the light emission control signal line EM and not causing the thin-film transistors (specifically, the power write transistor T1 and the light emission control transistor T6) connected to the light emission control signal line EM to be turned on by mistake. The first reference voltage line VREF1 and the light emission control signal line EM at least partially overlap so that along the second direction, a space occupied by the first reference voltage line VREF1 and a space occupied by the light emission control signal line EM overlap, thereby reducing the length of the pixel driving circuit 100 along the second direction and reducing the area of the space occupied by the pixel driving circuit 100.

Optionally, referring to FIG. 2, along the direction perpendicular to the plane of the substrate where the pixel driving circuit 100 is located, the second reference voltage line VREF2 and the first scanning line SN1 at least partially overlap. Along the direction perpendicular to the plane of the substrate where the pixel driving circuit 100 is located, the second reference voltage line VREF2 and the first sub-scanning line SN11 at least partially overlap; and along the direction perpendicular to the plane of the substrate where the pixel driving circuit 100 is located, the second reference voltage line VREF2 and the second sub-scanning line SN12 at least partially overlap. The second reference voltage line VREF2 is the constant voltage signal line 10, the first scanning line SN1 is the variable voltage signal line 20, the second reference voltage line VREF2 and the first scanning line SN1 at least partially overlap, and the voltage on the second reference voltage line VREF2 does not fluctuate, thereby not affecting the voltage on the first scanning line SN1 and not causing the thin-film transistor (specifically, the first reset transistor T5) connected to the first scanning line SN1 to be turned on by mistake. The second reference voltage line VREF2 and the first scanning line SN1 at least partially overlap so that along the second direction, a space occupied by the second reference voltage line VREF2 and a space occupied by the first scanning line SN1 overlap, thereby reducing the length of the pixel driving circuit 100 along the second direction and reducing the area of the space occupied by the pixel driving circuit 100.

Figure 15:
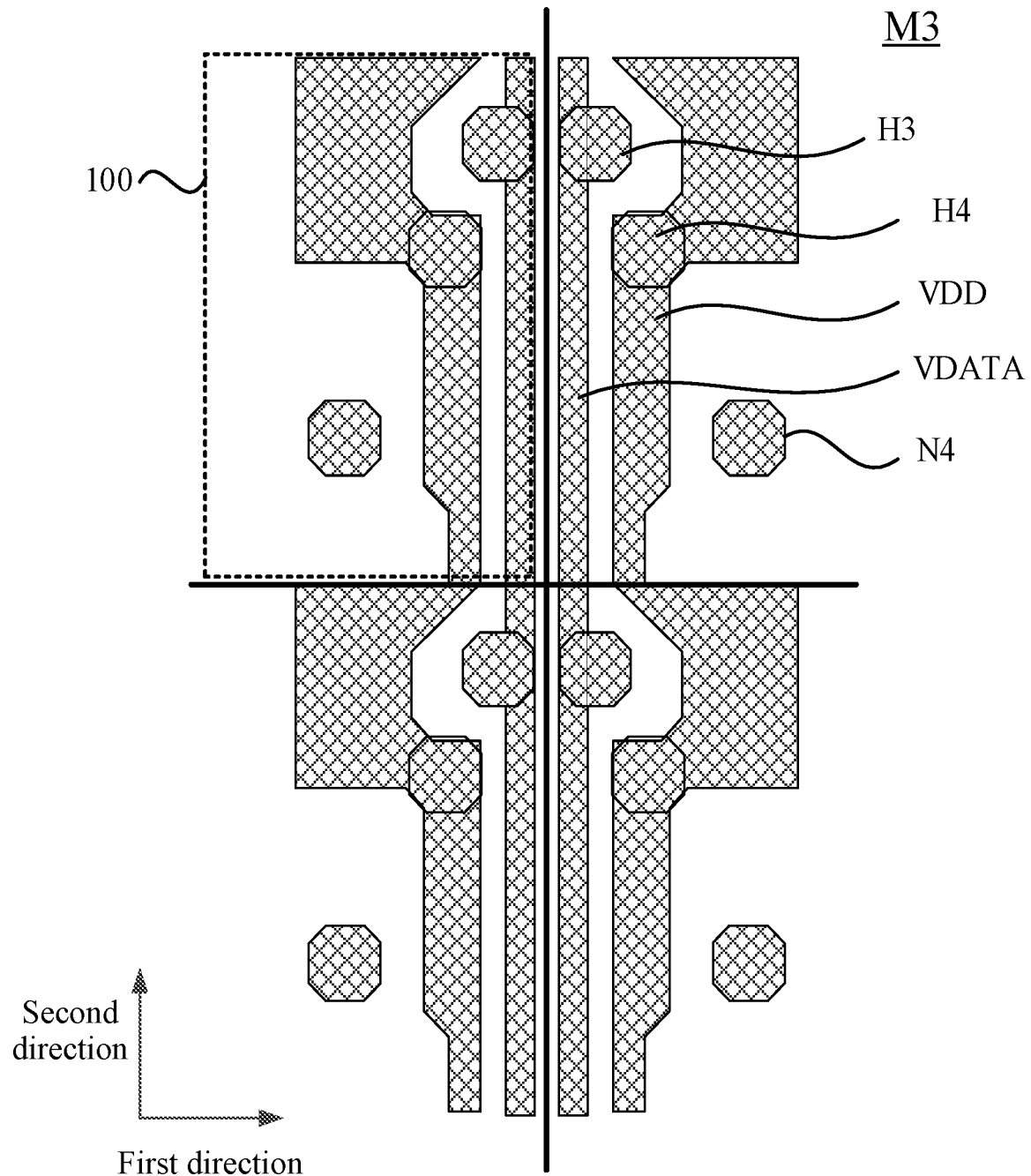
FIG. 15 is a top view of a third metal layer according to an embodiment of the present disclosure.

FIG. 15 is a top view of a third metal layer according to an embodiment of the present disclosure. Referring to FIGS. 1 to 9 and FIG. 15, the pixel driving circuit 100 further includes the data line VDATA and the first power line VDD, where both the data line VDATA and the first power line VDD extend along the second direction. In the present disclosure, the signal line extending along the second direction does not affect the length of the pixel driving circuit 100 along the second direction, so the signal line is not considered as the constant voltage signal line 10 or the variable voltage signal line 20. The data line VDATA and the first power line VDD are both disposed in a third metal layer M3, where the third metal layer M3 is disposed on one side of the second metal layer M2 facing away from the substrate 30.

By way of example, referring to FIGS. 12 and 15, at the third via H3, the layer is changed from the silicon semiconductor layer POLY to the second metal layer M2. Moreover, the second metal layer M2 is changed to another layer and connected to the data line VDATA disposed in the third metal layer M3.

By way of example, referring to FIGS. 10, 12 and 15, at a fourth via H4, the second metal layer M2 is changed to another layer and connected to the first power line VDD disposed in the third metal layer M3. The first via H1 is electrically connected to the fourth via H4 through the second metal layer M2, and at the first via H1, the second metal layer M2 is changed to another layer and connected to the second plate C2 disposed in the first sub-gate metal layer MG1 so that the second plate C2 disposed in the first sub-gate metal layer MG1 is connected to the first power line VDD disposed in the third metal layer M3.

By way of example, referring to FIGS. 1, 14 and 15, at the fourth node N4, the layer is changed from the silicon semiconductor layer POLY to the second metal layer M2 and then from the second metal layer M2 to the third metal layer M3, and then the third metal layer M3 is changed to another layer and connected to an anode of a light-emitting element LD. The anode of the light-emitting element LD is electrically connected to the fourth node N4. A cathode of the light-emitting element LD is electrically connected to a second power line VEE.

Figure 16:
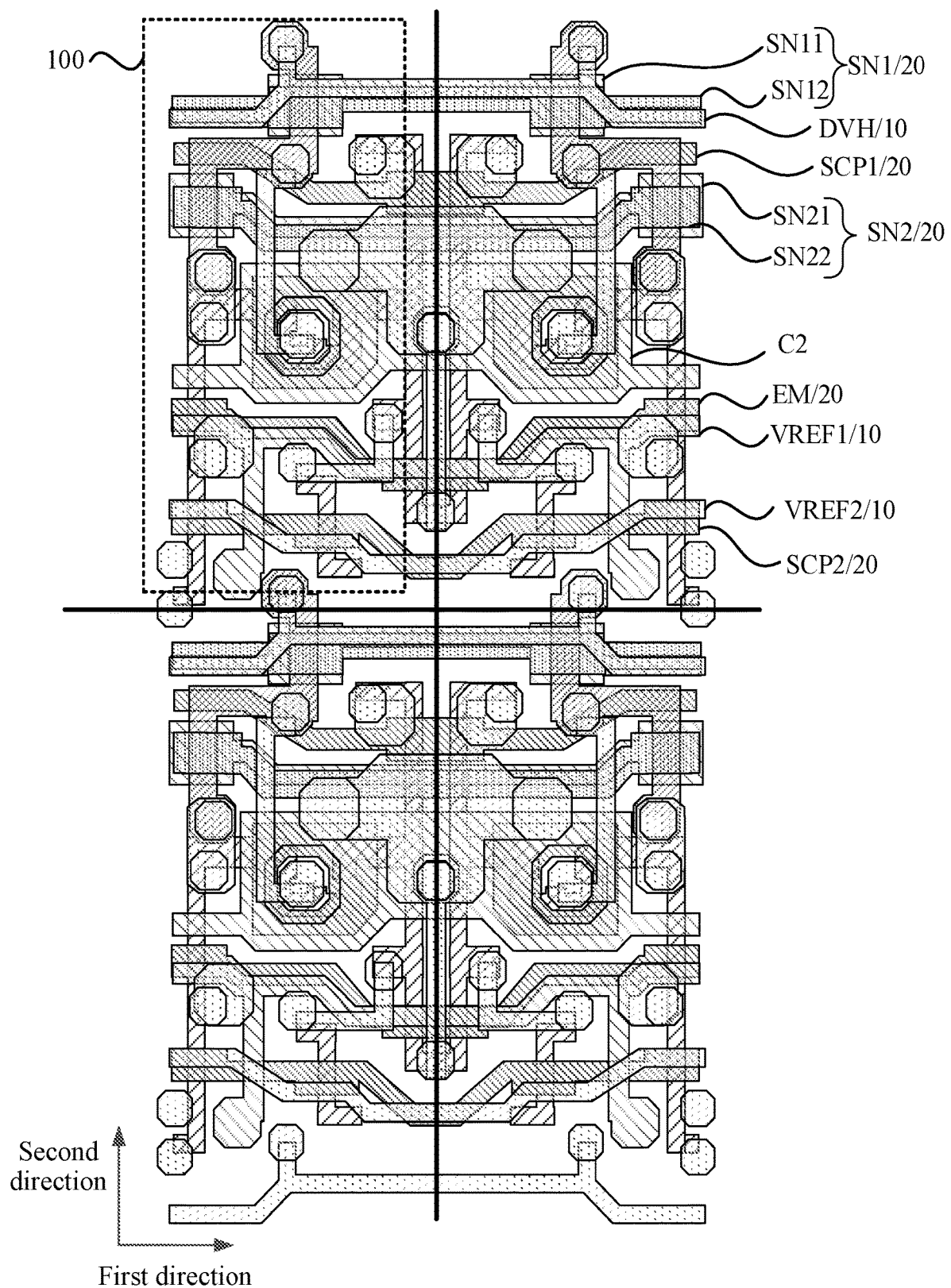
FIG. 16 is a top view of another pixel driving circuit according to an embodiment of the present disclosure.

FIG. 16 is a top view of another pixel driving circuit according to an embodiment of the present disclosure. Referring to FIG. 16, along the direction perpendicular to the plane of the substrate where the pixel driving circuit 100 is located, the initialization voltage line DVH and the first scanning line SN1 at least partially overlap. Along the direction perpendicular to the plane of the substrate where the pixel driving circuit 100 is located, the initialization voltage line DVH and the first sub-scanning line SN11 at least partially overlap; and along the direction perpendicular to the plane of the substrate where the pixel driving circuit 100 is located, the initialization voltage line DVH and the second sub-scanning line SN12 at least partially overlap. Therefore, along the second direction, a space occupied by the initialization voltage line DVH and a space occupied by the first scanning line SN1 overlap, thereby reducing the length of the pixel driving circuit 100 along the second direction and reducing the area of the space occupied by the pixel driving circuit 100.

By way of example, referring to FIGS. 3 and 16, the initialization voltage line DVH is disposed in the second metal layer M2. The first sub-scanning line SN11 is disposed in the first sub-gate metal layer MG1, and the second sub-scanning line SN12 is disposed in the second sub-gate metal layer MG2. The initialization voltage line DVH and the first sub-scanning line SN11 overlap in different layers, the initialization voltage line DVH and the second sub-scanning line SN12 overlap in different layers, and the initialization voltage line DVH and the first scanning line SN1 overlap in different layers.

Optionally, referring to FIG. 16, along the direction perpendicular to the plane of the substrate where the pixel driving circuit 100 is located, the first reference voltage line VREF1 and the light emission control signal line EM at least partially overlap. Therefore, along the second direction, a space occupied by the first reference voltage line VREF1 and a space occupied by the light emission control signal line EM overlap, thereby reducing the length of the pixel driving circuit 100 along the second direction and reducing the area of the space occupied by the pixel driving circuit 100.

By way of example, referring to FIGS. 3 and 16, the first reference voltage line VREF1 is disposed in the first sub-gate metal layer MG1. The light emission control signal line EM is disposed in the first metal layer M1. The first reference voltage line VREF1 and the light emission control signal line EM overlap in different layers.

Optionally, referring to FIG. 16, along the direction perpendicular to the plane of the substrate where the pixel driving circuit 100 is located, the second reference voltage line VREF2 and the initialization control signal line SCP2 at least partially overlap. Therefore, along the second direction, a space occupied by the second reference voltage line VREF2 and a space occupied by the initialization control signal line SCP2 overlap, thereby reducing the length of the pixel driving circuit 100 along the second direction and reducing the area of the space occupied by the pixel driving circuit 100. Further, the gate of the second reset transistor T7 is electrically connected to the initialization control signal line SCP2, the first electrode of the second reset transistor T7 is electrically connected to the second reference voltage line VREF2, the second reference voltage line VREF2 and the initialization control signal line SCP2 at least partially overlap, and a distance between the second reference voltage line VREF2 and the initialization control signal line SCP2 along the second direction is relatively small, so as to facilitate the connection between the second reset transistor T7 and the initialization control signal line SCP2 and the second reference voltage line VREF2, thereby reducing a length of a connection line between the second reset transistor T7 and the second reference voltage line VREF2.

By way of example, referring to FIGS. 3 and 16, the second reference voltage line VREF2 is disposed in the second metal layer M2. The initialization control signal line SCP2 is disposed in the first metal layer M1. The second reference voltage line VREF2 and the initialization control signal line SCP2 overlap in different layers.

Figure 17:
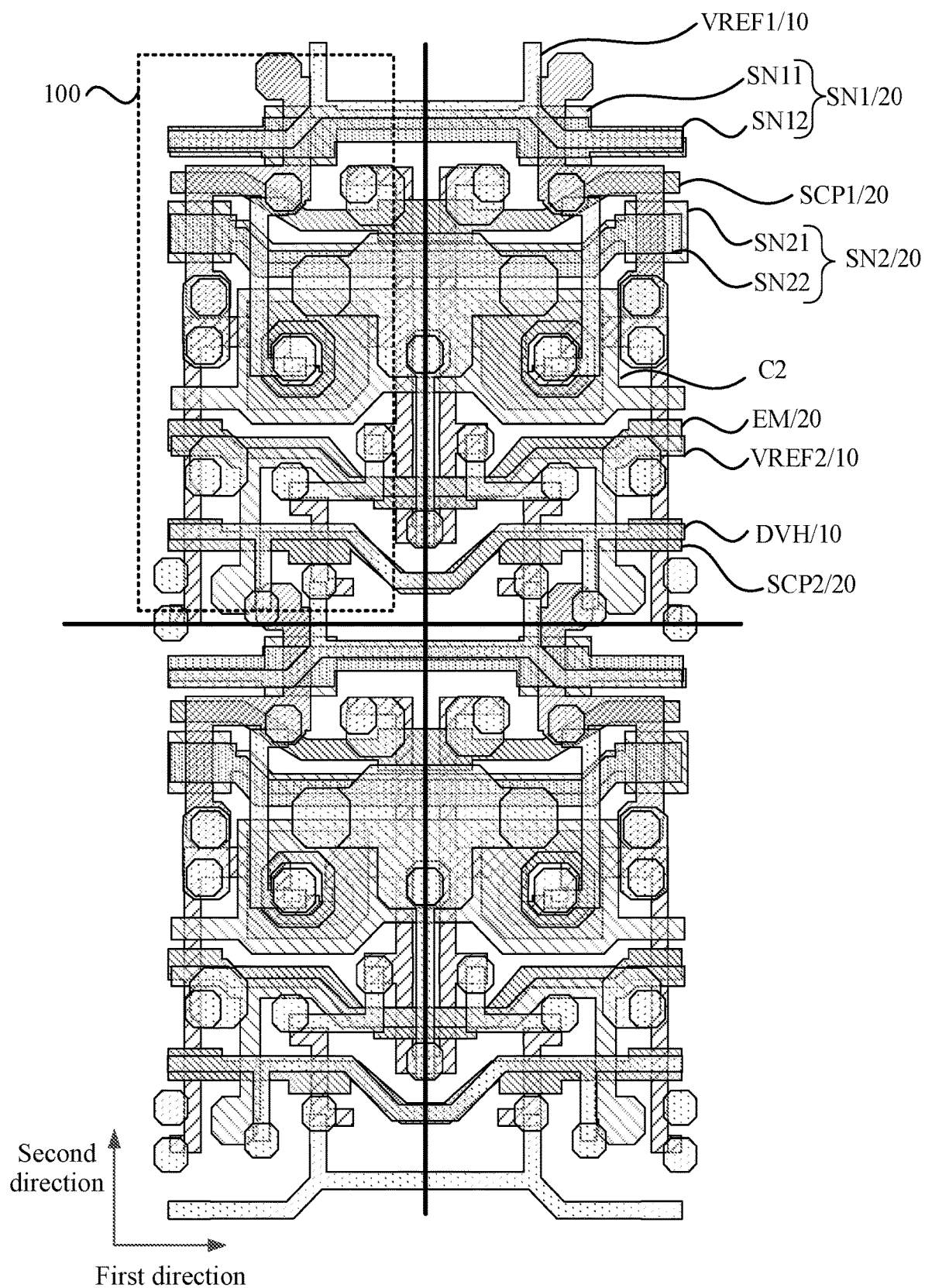
FIG. 17 is a top view of another pixel driving circuit according to an embodiment of the present disclosure.

FIG. 17 is a top view of another pixel driving circuit according to an embodiment of the present disclosure. Referring to FIG. 17, along the direction perpendicular to the plane of the substrate where the pixel driving circuit 100 is located, the first reference voltage line VREF1 and the first scanning line SN1 at least partially overlap. Along the direction perpendicular to the plane of the substrate where the pixel driving circuit 100 is located, the first reference voltage line VREF1 and the first sub-scanning line SN11 at least partially overlap; and along the direction perpendicular to the plane of the substrate where the pixel driving circuit 100 is located, the first reference voltage line VREF1 and the second sub-scanning line SN12 at least partially overlap. Therefore, along the second direction, a space occupied by the first reference voltage line VREF1 and a space occupied by the first scanning line SN1 overlap, thereby reducing the length of the pixel driving circuit 100 along the second direction and reducing the area of the space occupied by the pixel driving circuit 100. Further, the gate of the first reset transistor T5 is electrically connected to the first scanning line SN1, the first electrode of the first reset transistor T5 is electrically connected to the first reference voltage line VREF1, the first reference voltage line VREF1 and the first scanning line SN1 at least partially overlap, and a distance between the first reference voltage line VREF1 and the first scanning line SN1 along the second direction is relatively small, so as to facilitate the connection between the first reset transistor T5 and the first reference voltage line VREF1 and the first scanning line SN1, thereby reducing a length of a connection line between the first reset transistor T5 and the first reference voltage line VREF1.

By way of example, referring to FIGS. 3 and 17, the first reference voltage line VREF1 is disposed in the second metal layer M2. The first sub-scanning line SN11 is disposed in the first sub-gate metal layer MG1, and the second sub-scanning line SN12 is disposed in the second sub-gate metal layer MG2. The first reference voltage line VREF1 and the first sub-scanning line SN11 overlap in different layers, the first reference voltage line VREF1 and the second sub-scanning line SN12 overlap in different layers, and the first reference voltage line VREF1 and the first scanning line SN1 overlap in different layers.

Optionally, referring to FIG. 17, along the direction perpendicular to the plane of the substrate where the pixel driving circuit 100 is located, the second reference voltage line VREF2 and the light emission control signal line EM at least partially overlap. Therefore, along the second direction, a space occupied by the second reference voltage line VREF2 and a space occupied by the light emission control signal line EM overlap, thereby reducing the length of the pixel driving circuit 100 along the second direction and reducing the area of the space occupied by the pixel driving circuit 100.

By way of example, referring to FIGS. 3 and 17, the second reference voltage line VREF2 is disposed in the first sub-gate metal layer MG1. The light emission control signal line EM is disposed in the first metal layer M1. The second reference voltage line VREF2 and the light emission control signal line EM overlap in different layers.

Optionally, referring to FIG. 17, along the direction perpendicular to the plane of the substrate where the pixel driving circuit 100 is located, the initialization control signal line SCP2 and the initialization voltage line DVH at least partially overlap. Therefore, along the second direction, a space occupied by the initialization control signal line SCP2 and a space occupied by the initialization voltage line DVH overlap, thereby reducing the length of the pixel driving circuit 100 along the second direction and reducing the area of the space occupied by the pixel driving circuit 100.

By way of example, referring to FIGS. 3 and 17, the initialization voltage line DVH is disposed in the second metal layer M2. The initialization control signal line SCP2 is disposed in the first metal layer M1. The initialization control signal line SCP2 and the initialization voltage line DVH overlap in different layers.

Figure 18:
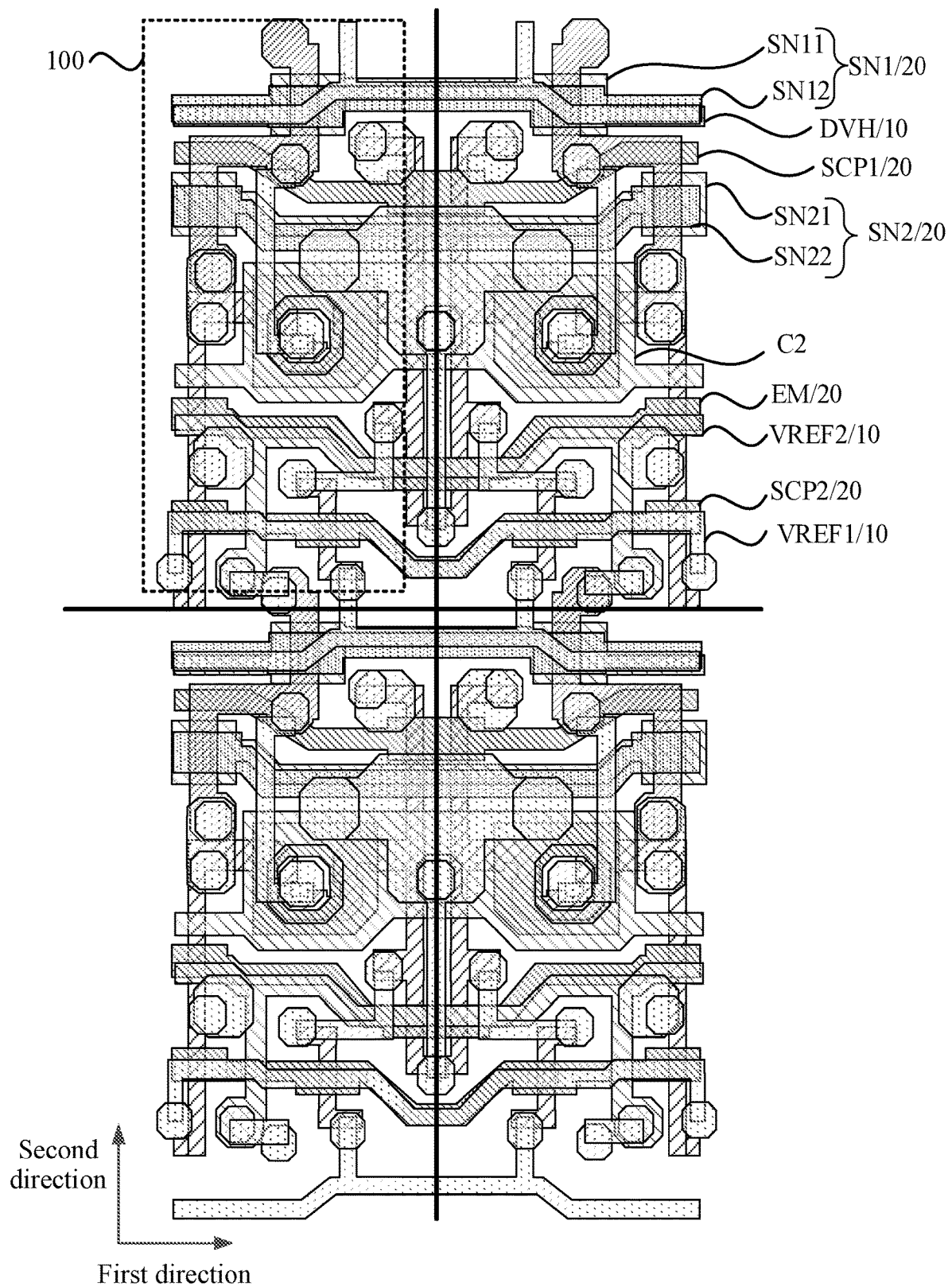
FIG. 18 is a top view of another pixel driving circuit according to an embodiment of the present disclosure.

FIG. 18 is a top view of another pixel driving circuit according to an embodiment of the present disclosure. Referring to FIG. 18, along the direction perpendicular to the plane of the substrate where the pixel driving circuit 100 is located, the initialization voltage line DVH and the first scanning line SN1 at least partially overlap. Along the direction perpendicular to the plane of the substrate where the pixel driving circuit 100 is located, the initialization voltage line DVH and the first sub-scanning line SN11 at least partially overlap; and along the direction perpendicular to the plane of the substrate where the pixel driving circuit 100 is located, the initialization voltage line DVH and the second sub-scanning line SN12 at least partially overlap. Therefore, along the second direction, a space occupied by the initialization voltage line DVH and a space occupied by the first scanning line SN1 overlap, thereby reducing the length of the pixel driving circuit 100 along the second direction and reducing the area of the space occupied by the pixel driving circuit 100.

By way of example, referring to FIGS. 3 and 18, the initialization voltage line DVH is disposed in the second metal layer M2. The first sub-scanning line SN11 is disposed in the first sub-gate metal layer MG1, and the second sub-scanning line SN12 is disposed in the second sub-gate metal layer MG2. The initialization voltage line DVH and the first sub-scanning line SN11 overlap in different layers, the initialization voltage line DVH and the second sub-scanning line SN12 overlap in different layers, and the initialization voltage line DVH and the first scanning line SN1 overlap in different layers.

Optionally, referring to FIG. 18, along the direction perpendicular to the plane of the substrate where the pixel driving circuit 100 is located, the second reference voltage line VREF2 and the light emission control signal line EM at least partially overlap. Therefore, along the second direction, a space occupied by the second reference voltage line VREF2 and a space occupied by the light emission control signal line EM overlap, thereby reducing the length of the pixel driving circuit 100 along the second direction and reducing the area of the space occupied by the pixel driving circuit 100.

By way of example, referring to FIGS. 3 and 18, the second reference voltage line VREF2 is disposed in the first sub-gate metal layer MG1. The light emission control signal line EM is disposed in the first metal layer M1. The second reference voltage line VREF2 and the light emission control signal line EM overlap in different layers.

Optionally, referring to FIG. 18, along the direction perpendicular to the plane of the substrate where the pixel driving circuit 100 is located, the first reference voltage line VREF1 and the initialization control signal line SCP2 at least partially overlap. Therefore, along the second direction, a space occupied by the first reference voltage line VREF1 and a space occupied by the initialization control signal line SCP2 overlap, thereby reducing the length of the pixel driving circuit 100 along the second direction and reducing the area of the space occupied by the pixel driving circuit 100.

By way of example, referring to FIGS. 3 and 18, the first reference voltage line VREF1 is disposed in the second metal layer M2. The initialization control signal line SCP2 is disposed in the first metal layer M1. The first reference voltage line VREF1 and the initialization control signal line SCP2 overlap in different layers.

Figure 19:
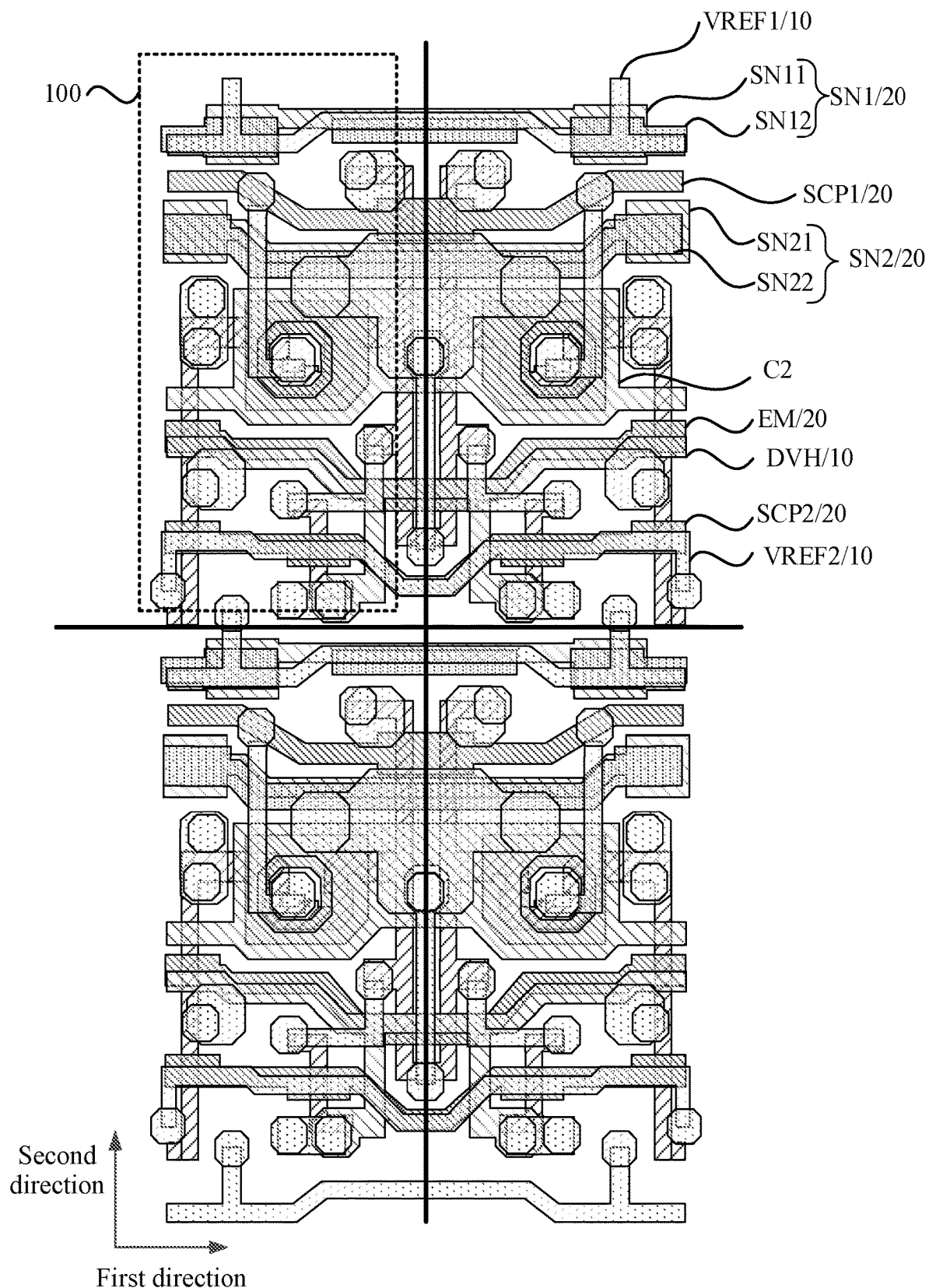
FIG. 19 is a top view of another pixel driving circuit according to an embodiment of the present disclosure.

FIG. 19 is a top view of another pixel driving circuit according to an embodiment of the present disclosure. Referring to FIG. 19, along the direction perpendicular to the plane of the substrate where the pixel driving circuit 100 is located, the first reference voltage line VREF1 and the first scanning line SN1 at least partially overlap. Along the direction perpendicular to the plane of the substrate where the pixel driving circuit 100 is located, the first reference voltage line VREF1 and the first sub-scanning line SN11 at least partially overlap; and along the direction perpendicular to the plane of the substrate where the pixel driving circuit 100 is located, the first reference voltage line VREF1 and the second sub-scanning line SN12 at least partially overlap. Therefore, along the second direction, a space occupied by the first reference voltage line VREF1 and a space occupied by the first scanning line SN1 overlap, thereby reducing the length of the pixel driving circuit 100 along the second direction and reducing the area of the space occupied by the pixel driving circuit 100.

By way of example, referring to FIGS. 3 and 19, the first reference voltage line VREF1 is disposed in the second metal layer M2. The first sub-scanning line SN11 is disposed in the first sub-gate metal layer MG1, and the second sub-scanning line SN12 is disposed in the second sub-gate metal layer MG2. The first reference voltage line VREF1 and the first sub-scanning line SN11 overlap in different layers, the first reference voltage line VREF1 and the second sub-scanning line SN12 overlap in different layers, and the first reference voltage line VREF1 and the first scanning line SN1 overlap in different layers.

Optionally, referring to FIG. 19, along the direction perpendicular to the plane of the substrate where the pixel driving circuit 100 is located, the initialization voltage line DVH and the light emission control signal line EM at least partially overlap. Therefore, along the second direction, a space occupied by the initialization voltage line DVH and a space occupied by the light emission control signal line EM overlap, thereby reducing the length of the pixel driving circuit 100 along the second direction and reducing the area of the space occupied by the pixel driving circuit 100.

By way of example, referring to FIGS. 3 and 19, the initialization voltage line DVH is disposed in the first sub-gate metal layer MG1. The light emission control signal line EM is disposed in the first metal layer M1. The initialization voltage line DVH and the light emission control signal line EM overlap in different layers.

Optionally, referring to FIG. 19, along the direction perpendicular to the plane of the substrate where the pixel driving circuit 100 is located, the second reference voltage line VREF2 and the initialization control signal line SCP2 at least partially overlap. Therefore, along the second direction, a space occupied by the second reference voltage line VREF2 and a space occupied by the initialization control signal line SCP2 overlap, thereby reducing the length of the pixel driving circuit 100 along the second direction and reducing the area of the space occupied by the pixel driving circuit 100.

By way of example, referring to FIGS. 3 and 19, the second reference voltage line VREF2 is disposed in the second metal layer M2. The initialization control signal line SCP2 is disposed in the first metal layer M1. The second reference voltage line VREF2 and the initialization control signal line SCP2 overlap in different layers.

Figure 20:
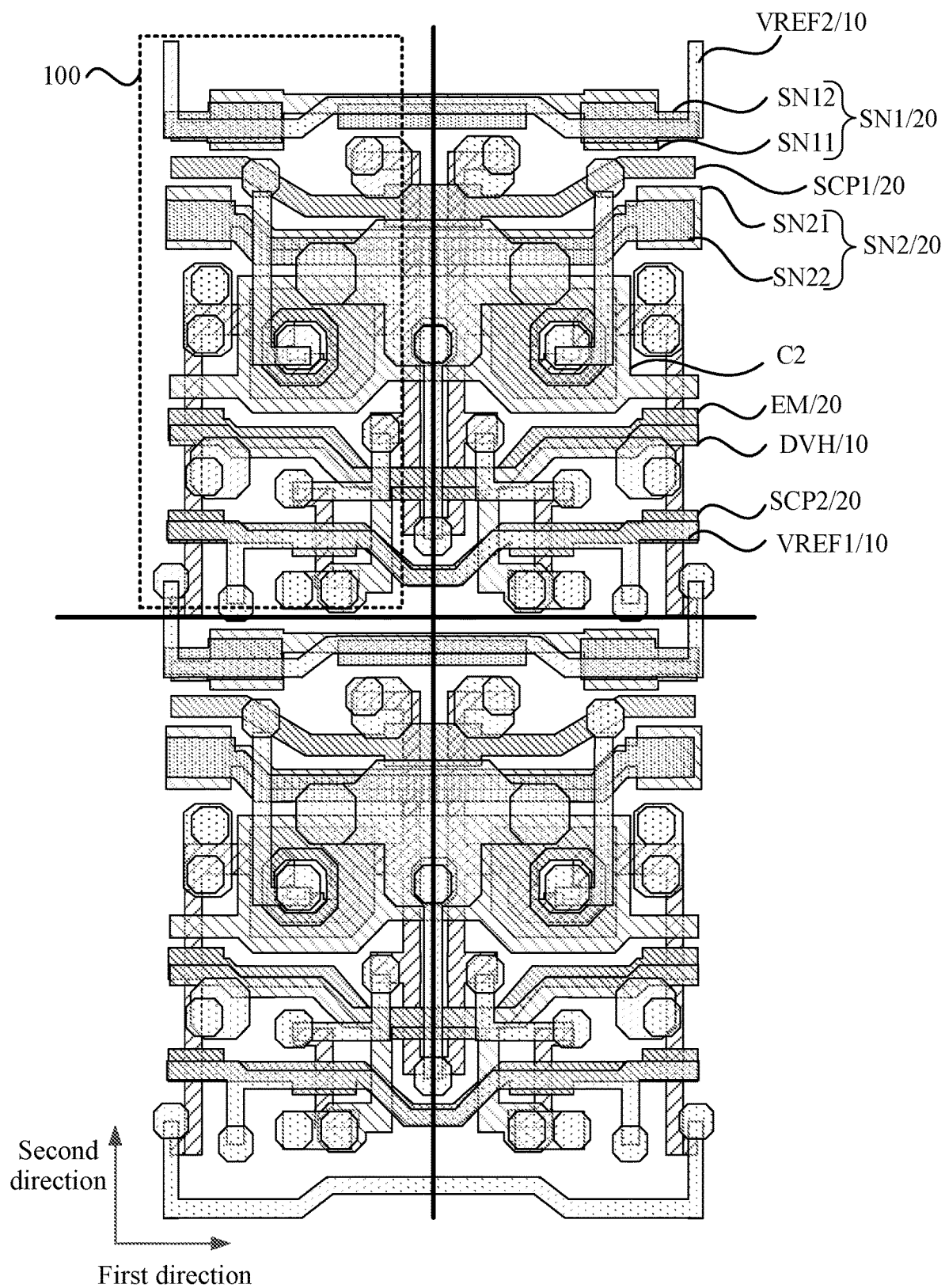
FIG. 20 is a top view of another pixel driving circuit according to an embodiment of the present disclosure.

FIG. 20 is a top view of another pixel driving circuit according to an embodiment of the present disclosure. Referring to FIG. 20, along the direction perpendicular to the plane of the substrate where the pixel driving circuit 100 is located, the second reference voltage line VREF2 and the first scanning line SN1 at least partially overlap. Along the direction perpendicular to the plane of the substrate where the pixel driving circuit 100 is located, the second reference voltage line VREF2 and the first sub-scanning line SN11 at least partially overlap; and along the direction perpendicular to the plane of the substrate where the pixel driving circuit 100 is located, the second reference voltage line VREF2 and the second sub-scanning line SN12 at least partially overlap. The second reference voltage line VREF2 and the first scanning line SN1 at least partially overlap so that along the second direction, a space occupied by the second reference voltage line VREF2 and a space occupied by the first scanning line SN1 overlap, thereby reducing the length of the pixel driving circuit 100 along the second direction and reducing the area of the space occupied by the pixel driving circuit 100.

By way of example, referring to FIGS. 3 and 20, the second reference voltage line VREF2 is disposed in the second metal layer M2. The first sub-scanning line SN11 is disposed in the first sub-gate metal layer MG1, and the second sub-scanning line SN12 is disposed in the second sub-gate metal layer MG2. The second reference voltage line VREF2 and the first sub-scanning line SN11 overlap in different layers, the second reference voltage line VREF2 and the second sub-scanning line SN12 overlap in different layers, and the second reference voltage line VREF2 and the first scanning line SN1 overlap in different layers.

Optionally, referring to FIG. 20, along the direction perpendicular to the plane of the substrate where the pixel driving circuit 100 is located, the initialization voltage line DVH and the light emission control signal line EM at least partially overlap. Therefore, along the second direction, a space occupied by the initialization voltage line DVH and a space occupied by the light emission control signal line EM overlap, thereby reducing the length of the pixel driving circuit 100 along the second direction and reducing the area of the space occupied by the pixel driving circuit 100.

By way of example, referring to FIGS. 3 and 20, the initialization voltage line DVH is disposed in the first sub-gate metal layer MG1. The light emission control signal line EM is disposed in the first metal layer M1. The initialization voltage line DVH and the light emission control signal line EM overlap in different layers.

Optionally, referring to FIG. 20, along the direction perpendicular to the plane of the substrate where the pixel driving circuit 100 is located, the first reference voltage line VREF1 and the initialization control signal line SCP2 at least partially overlap. Therefore, along the second direction, a space occupied by the first reference voltage line VREF1 and a space occupied by the initialization control signal line SCP2 overlap, thereby reducing the length of the pixel driving circuit 100 along the second direction and reducing the area of the space occupied by the pixel driving circuit 100.

By way of example, referring to FIGS. 3 and 20, the first reference voltage line VREF1 is disposed in the second metal layer M2. The initialization control signal line SCP2 is disposed in the first metal layer M1. The first reference voltage line VREF1 and the initialization control signal line SCP2 overlap in different layers.

Optionally, referring to FIG. 2 and FIGS. 16 to 20, along the second direction, the initialization control signal line SCP2, the light emission control signal line EM, the second scanning line SN2, the data write control signal line SCP1, and the first scanning line SN1 are arranged in sequence. Along the second direction, the light emission control signal line EM is disposed between the initialization control signal line SCP2 and the second scanning line SN2, the second scanning line SN2 is disposed between the light emission control signal line EM and the data write control signal line SCP1, and the data write control signal line SCP1 is disposed between the second scanning line SN2 and the first scanning line SN1. It is to be understood that the initialization control signal line SCP2, the light emission control signal line EM, the second scanning line SN2, the data write control signal line SCP1, and the first scanning line SN1 are all variable voltage signal lines 20, and the semiconductor layer 314 of the thin-film transistor is formed at a position where the variable voltage signal lines 20 overlap with the silicon semiconductor layer POLY and the oxide semiconductor layer IGZO. An arrangement sequence of the variable voltage signal lines 20 is selected as follows: along the second direction, the initialization control signal line SCP2, the light emission control signal line EM, the second scanning line SN2, the data write control signal line SCP1, and the first scanning line SN1 are arranged in sequence so that preferred positions of the thin-film transistors may be formed.

Optionally, referring to FIG. 2 and FIGS. 16 to 20, the constant voltage signal line 10 at least partially overlapping with the light emission control signal line EM is disposed in the first sub-gate metal layer MG1.

By way of example, referring to FIG. 2 or 16, the first reference voltage line VREF1 and the light emission control signal line EM at least partially overlap, and the first reference voltage line VREF1 is disposed in the first sub-gate metal layer MG1.

By way of example, referring to FIG. 17 or 18, the second reference voltage line VREF2 and the light emission control signal line EM at least partially overlap, and the second reference voltage line VREF2 is disposed in the first sub-gate metal layer MG1.

By way of example, referring to FIG. 19 or 20, the initialization voltage line DVH and the light emission control signal line EM at least partially overlap, and the initialization voltage line DVH is disposed in the first sub-gate metal layer MG1.

In other embodiments, the constant voltage signal line 10 at least partially overlapping with the light emission control signal line EM may also be disposed in the second sub-gate metal layer MG2.

Optionally, referring to FIGS. 2 and FIGS. 16 to 20, the constant voltage signal line 10 at least partially overlapping with the initialization control signal line SCP2 is disposed in the second metal layer M2, and the constant voltage signal line 10 at least partially overlapping with the first scanning line SN1 is disposed in the second metal layer M2.

By way of example, referring to FIG. 2, the initialization voltage line DVH and the initialization control signal line SCP2 at least partially overlap, the second reference voltage line VREF2 and the first scanning line SN1 at least partially overlap, and the initialization voltage line DVH and the second reference voltage line VREF2 are both disposed in the second metal layer M2.

By way of example, referring to FIG. 16, the second reference voltage line VREF2 and the initialization control signal line SCP2 at least partially overlap, the initialization voltage line DVH and the first scanning line SN1 at least partially overlap, and the initialization voltage line DVH and the second reference voltage line VREF2 are both disposed in the second metal layer M2.

By way of example, referring to FIG. 17, the initialization voltage line DVH and the initialization control signal line SCP2 at least partially overlap, the first reference voltage line VREF1 and the first scanning line SN1 at least partially overlap, and the initialization voltage line DVH and the first reference voltage line VREF1 are both disposed in the second metal layer M2.

By way of example, referring to FIG. 18, the first reference voltage line VREF1 and the initialization control signal line SCP2 at least partially overlap, the initialization voltage line DVH and the first scanning line SN1 at least partially overlap, and the initialization voltage line DVH and the first reference voltage line VREF1 are both disposed in the second metal layer M2.

By way of example, referring to FIG. 19, the second reference voltage line VREF2 and the initialization control signal line SCP2 at least partially overlap, the first reference voltage line VREF1 and the first scanning line SN1 at least partially overlap, and the first reference voltage line VREF1 and the second reference voltage line VREF2 are both disposed in the second metal layer M2.

By way of example, referring to FIG. 20, the first reference voltage line VREF1 and the initialization control signal line SCP2 at least partially overlap, the second reference voltage line VREF2 and the first scanning line SN1 at least partially overlap, and the first reference voltage line VREF1 and the second reference voltage line VREF2 are both disposed in the second metal layer M2.

Figure 21:
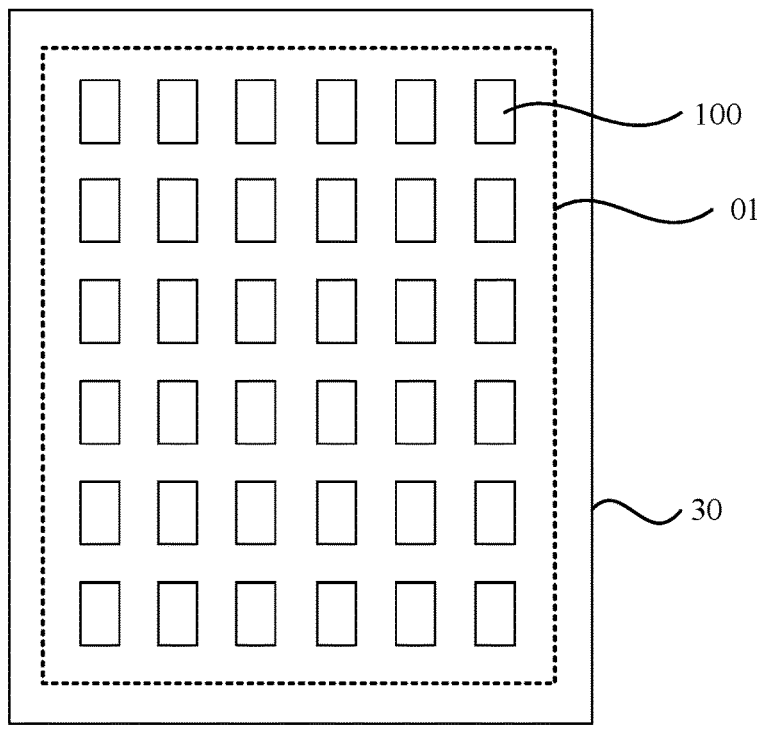
FIG. 21 is a top view of a display panel according to an embodiment of the present disclosure.
Figure 22:
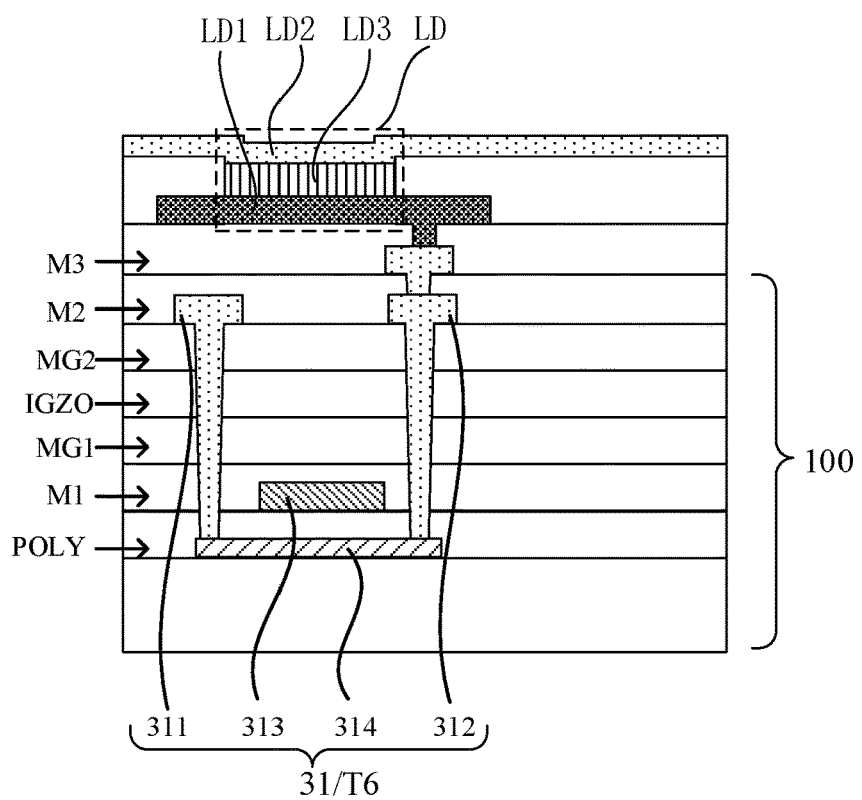
FIG. 22 is a sectional view of a display panel according to an embodiment of the present disclosure.

FIG. 21 is a top view of a display panel according to an embodiment of the present disclosure, and FIG. 22 is a sectional view of a display panel according to an embodiment of the present disclosure. Referring to FIGS. 21 and 22, the display panel includes a display region 01, where the display region 01 includes multiple pixel driving circuits 100 according to the preceding embodiments and multiple light-emitting elements LDs. The display panel may be one of an organic light-emitting display panel, a liquid crystal display panel, a quantum dot display panel, or a micro light-emitting diode display panel.

By way of example, referring to FIGS. 21 and 22, the display panel further includes the pixel driving circuits 100 and the light-emitting elements LDs disposed in the display region 01. The light-emitting element LD includes an anode LD1, a cathode LD2, and a light-emitting function layer LD3. The light-emitting function layer LD3 is disposed between the anode LD1 and the cathode LD2. Electrons and holes are injected into the light-emitting function layer LD3 from the cathode LD2 and the anode LD1, respectively and combined so as to generate excitons. The energy is transferred to light-emitting molecules of the light-emitting function layer LD3, and the electrons are excited to transition from the ground state to the excited state. The energy of the excited state is released through radiation transition, so as to generate light.

Figure 23:
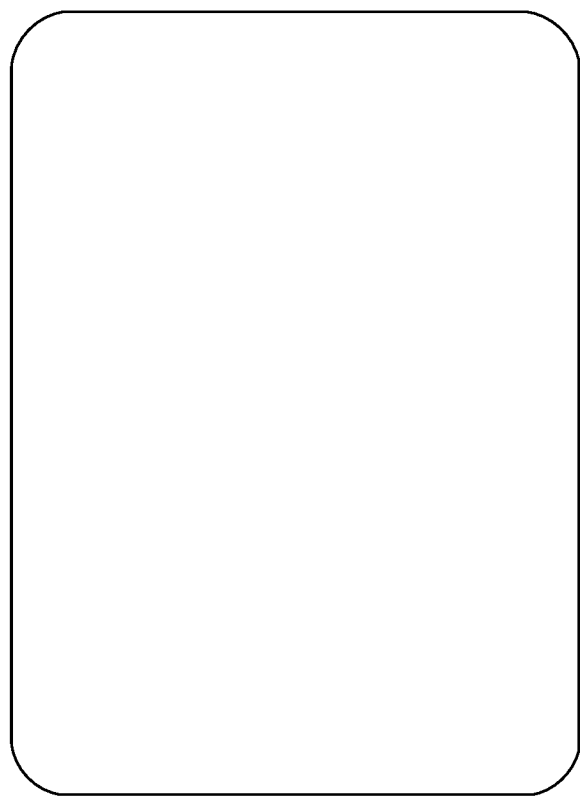
FIG. 23 is a schematic diagram of a display device according to an embodiment of the present disclosure.

FIG. 23 is a schematic diagram of a display device according to an embodiment of the present disclosure. Referring to FIG. 23, the display device includes the display panel described in the preceding embodiments. The display device may be one of a mobile phone, a computer, an electronic paper, a vehicle-mounted display, a wearable device, or the like.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure is described in detail in connection with the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A pixel driving circuit, comprising: a drive transistor, an initialization transistor, a constant voltage signal line, and a variable voltage signal line;

wherein a voltage value on the constant voltage signal line is a constant value, and a voltage value on the variable voltage signal line varies with time, and both the constant voltage signal line and the variable voltage signal line extend along a first direction;

the constant voltage signal line comprises an initialization voltage line, and the variable voltage signal line comprises an initialization control signal line;

the drive transistor comprises a gate, a first electrode, and a second electrode, and the first electrode of the drive transistor is configured for writing a first power signal;

a first electrode of the initialization transistor is electrically connected to the initialization voltage line, a second electrode of the initialization transistor is electrically connected to the first electrode or the second electrode of the drive transistor, and a gate of the initialization transistor is electrically connected to the initialization control signal line and configured for turning on the initialization transistor according to a control signal on the initialization control signal line so as to initialize the first electrode or the second electrode of the drive transistor; and along a direction perpendicular to a plane of a substrate where the pixel driving circuit is located, the initialization control signal line at least partially overlaps with the initialization voltage line.

2. The pixel driving circuit of claim 1, further comprising: a light emission control transistor and a first reset transistor; wherein the constant voltage signal line further comprises a first reference voltage line, and the variable voltage signal line further comprises a light emission control signal line and a first scanning line;

a first electrode of the light emission control transistor is electrically connected to the second electrode of the drive transistor, a second electrode of the light emission control transistor is electrically connected to an anode of a light-emitting element, and a gate of the light emission control transistor is electrically connected to the light emission control signal line;

a first electrode of the first reset transistor is electrically connected to the first reference voltage line, a second electrode of the first reset transistor is electrically connected to a gate of the drive transistor, and a gate of the first reset transistor is electrically connected to the first scanning line; and along the direction perpendicular to the plane of the substrate where the pixel driving circuit is located, the first reference voltage line and the light emission control signal line at least partially overlap.

3. The pixel driving circuit of claim 1, further comprising a first reset transistor;

wherein the constant voltage signal line further comprises a first reference voltage line, and the variable voltage signal line further comprises a first scanning line;

a first electrode of the first reset transistor is electrically connected to the first reference voltage line, a second electrode of the first reset transistor is electrically connected to a gate of the drive transistor, and a gate of the first reset transistor is electrically connected to the first scanning line; and along the direction perpendicular to the plane of the substrate where the pixel driving circuit is located, the initialization voltage line at least partially overlaps with the first scanning line.

4. The pixel driving circuit of claim 3, further comprising a light emission control transistor; wherein the variable voltage signal line further comprises a light emission control signal line;

a first electrode of the light emission control transistor is electrically connected to the second electrode of the drive transistor, a second electrode of the light emission control transistor is electrically connected to an anode of a light-emitting element, and a gate of the light emission control transistor is electrically connected to the light emission control signal line; and along the direction perpendicular to the plane of the substrate where the pixel driving circuit is located, the first reference voltage line and the light emission control signal line at least partially overlap.

5. The pixel driving circuit of claim 3, wherein along the direction perpendicular to the plane of the substrate where the pixel driving circuit is located, the first reference voltage line and the initialization control signal line at least partially overlap.

6. The pixel driving circuit of claim 3, further comprising a second reset transistor; wherein the constant voltage signal line further comprises a second reference voltage line;

a first electrode of the second reset transistor is electrically connected to the second reference voltage line, a second electrode of the second reset transistor is electrically connected to the anode of the light-emitting element, and a gate of the second reset transistor is electrically connected to the initialization control signal line; and along the direction perpendicular to the plane of the substrate where the pixel driving circuit is located, the second reference voltage line and the initialization control signal line at least partially overlap.

7. The pixel driving circuit of claim 1, further comprising a light emission control transistor and a second reset transistor; wherein the constant voltage signal line further comprises a second reference voltage line, and the variable voltage signal line further comprises a light emission control signal line;

a first electrode of the light emission control transistor is electrically connected to the second electrode of the drive transistor, a second electrode of the light emission control transistor is electrically connected to an anode of a light-emitting element, and a gate of the light emission control transistor is electrically connected to the light emission control signal line;

a first electrode of the second reset transistor is electrically connected to the second reference voltage line, a second electrode of the second reset transistor is electrically connected to the anode of the light-emitting element, and a gate of the second reset transistor is electrically connected to the initialization control signal line; and along the direction perpendicular to the plane of the substrate where the pixel driving circuit is located, the second reference voltage line and the light emission control signal line at least partially overlap.

8. The pixel driving circuit of claim 1, further comprising a light emission control transistor; wherein the variable voltage signal line further comprises a light emission control signal line;

a first electrode of the light emission control transistor is electrically connected to the second electrode of the drive transistor, a second electrode of the light emission control transistor is electrically connected to an anode of a light-emitting element, and a gate of the light emission control transistor is electrically connected to the light emission control signal line; and along the direction perpendicular to the plane of the substrate where the pixel driving circuit is located, the initialization voltage line and the light emission control signal line at least partially overlap.

9. The pixel driving circuit of claim 8, further comprising a first reset transistor; wherein the constant voltage signal line further comprises a first reference voltage line, and the variable voltage signal line further comprises a first scanning line;

a first electrode of the first reset transistor is electrically connected to the first reference voltage line, a second electrode of the first reset transistor is electrically connected to a gate of the drive transistor, and a gate of the first reset transistor is electrically connected to the first scanning line; and along the direction perpendicular to the plane of the substrate where the pixel driving circuit is located, the first reference voltage line and the initialization control signal line at least partially overlap.

10. The pixel driving circuit of claim 1, further comprising a first reset transistor and a second reset transistor; wherein the constant voltage signal line further comprises a first reference voltage line and a second reference voltage line, and the variable voltage signal line further comprises a first scanning line;

a first electrode of the first reset transistor is electrically connected to the first reference voltage line, a second electrode of the first reset transistor is electrically connected to a gate of the drive transistor, and a gate of the first reset transistor is electrically connected to the first scanning line;

a first electrode of the second reset transistor is electrically connected to the second reference voltage line, a second electrode of the second reset transistor is electrically connected to the anode of the light-emitting element, and a gate of the second reset transistor is electrically connected to the initialization control signal line; and along the direction perpendicular to the plane of the substrate where the pixel driving circuit is located, the second reference voltage line at least partially overlaps with the first scanning line.

11. The pixel driving circuit of claim 1, further comprising a first reset transistor; wherein the constant voltage signal line further comprises a first reference voltage line, and the variable voltage signal line further comprises a first scanning line;

a first electrode of the first reset transistor is electrically connected to the first reference voltage line, a second electrode of the first reset transistor is electrically connected to a gate of the drive transistor, and a gate of the first reset transistor is electrically connected to the first scanning line; and along the direction perpendicular to the plane of the substrate where the pixel driving circuit is located, the first reference voltage line at least partially overlaps with the first scanning line.

12. The pixel driving circuit of claim 1, further comprising a first reset transistor, a light emission control transistor, a compensation transistor, a data write transistor, a storage capacitor, a data line, and a first power line; wherein the variable voltage signal line further comprises a first scanning line, a light emission control signal line, a second scanning line, and a data write control signal line, and the constant voltage signal line further comprises a first reference voltage line;

a first electrode of the first reset transistor is electrically connected to the first reference voltage line, a second electrode of the first reset transistor is electrically connected to a gate of the drive transistor, and a gate of the first reset transistor is electrically connected to the first scanning line; and a first electrode of the light emission control transistor is electrically connected to the second electrode of the drive transistor, a second electrode of the light emission control transistor is electrically connected to an anode of a light-emitting element, and a gate of the light emission control transistor is electrically connected to the light emission control signal line;

a first electrode of the compensation transistor is electrically connected to the gate of the drive transistor, a second electrode of the compensation transistor is electrically connected to the second electrode of the drive transistor, and a gate of the compensation transistor is electrically connected to the second scanning line;

a first electrode of the data write transistor is electrically connected to the data line, a second electrode of the data write transistor is electrically connected to the first electrode of the drive transistor, and a gate of the data write transistor is electrically connected to the data write control signal line;

a first plate of the storage capacitor is electrically connected to the gate of the drive transistor, and a second plate of the storage capacitor is electrically connected to the first power line; and along a second direction, the initialization control signal line, the light emission control signal line, the second scanning line, the data write control signal line, and the first scanning line are arranged in sequence; wherein the second direction intersects with the first direction.

13. The pixel driving circuit of claim 12, wherein a semiconductor layer of any one of the data write transistor, the drive transistor, the light emission control transistor, or the initialization transistor comprises silicon; and a semiconductor layer of any one of the compensation transistor or the first reset transistor comprises an oxide.

14. The pixel driving circuit of claim 13, wherein the compensation transistor comprises a first sub-gate and a second sub-gate;

the first sub-gate is disposed in a first sub-gate metal layer, and along the direction perpendicular to the plane of the substrate where the pixel driving circuit is located, the first sub-gate is disposed between the semiconductor layer of the drive transistor and the semiconductor layer of the compensation transistor;

the second sub-gate is disposed in a second sub-gate metal layer, and along the direction perpendicular to the plane of the substrate where the pixel driving circuit is located, the second sub-gate is disposed on one side of the semiconductor layer of the compensation transistor facing away from the first sub-gate; and the constant voltage signal line at least partially overlapping with the light emission control signal line is disposed in the first sub-gate metal layer or the second sub-gate metal layer.

15. The pixel driving circuit of claim 13, wherein the gate of the drive transistor is disposed in a first metal layer;

the light emission control signal line, the data write control signal line, and the initialization control signal line are all disposed in the first metal layer;

the compensation transistor comprises a first sub-gate and a second sub-gate;

the first sub-gate is disposed in a first sub-gate metal layer, and along the direction perpendicular to the plane of the substrate where the pixel driving circuit is located, the first sub-gate is disposed between the semiconductor layer of the drive transistor and the semiconductor layer of the compensation transistor;

the second sub-gate is disposed in a second sub-gate metal layer, and along the direction perpendicular to the plane of the substrate where the pixel driving circuit is located, the second sub-gate is disposed on one side of the semiconductor layer of the compensation transistor facing away from the first sub-gate; and the first scanning line comprises a first sub-scanning line and a second sub-scanning line, and the second scanning line comprises a third sub-scanning line and a fourth sub-scanning line, wherein the first sub-scanning line and the third sub-scanning line are disposed in the first sub-gate metal layer, and the second sub-scanning line and the fourth sub-scanning line are disposed in the second sub-gate metal layer.

16. The pixel driving circuit of claim 13, wherein a source and a drain of the drive transistor are disposed in a second metal layer; and the constant voltage signal line at least partially overlapping with the initialization control signal line is disposed in the second metal layer, and the constant voltage signal line at least partially overlapping with the first scanning line is disposed in the second metal layer.

17. The pixel driving circuit of claim 13, wherein a source and a drain of the drive transistor are disposed in a second metal layer; and along the direction perpendicular to the plane of the substrate where the pixel driving circuit is located, the data line and the first power line are disposed on one side of the second metal layer facing away from the semiconductor layer of the drive transistor.

18. A display panel, comprising a display region, wherein the display region comprises a plurality of pixel driving circuits and a plurality of light-emitting elements;

wherein each of the plurality of pixel driving circuits comprises:

a drive transistor, an initialization transistor, a constant voltage signal line, and a variable voltage signal line;

wherein a voltage value on the constant voltage signal line is a constant value, and a voltage value on the variable voltage signal line varies with time, and both the constant voltage signal line and the variable voltage signal line extend along a first direction;

the constant voltage signal line comprises an initialization voltage line, and the variable voltage signal line comprises an initialization control signal line;

the drive transistor comprises a gate, a first electrode, and a second electrode, and the first electrode of the drive transistor is configured for writing a first power signal;

a first electrode of the initialization transistor is electrically connected to the initialization voltage line, a second electrode of the initialization transistor is electrically connected to the first electrode or the second electrode of the drive transistor, and a gate of the initialization transistor is electrically connected to the initialization control signal line and configured for turning on the initialization transistor according to a control signal on the initialization control signal line so as to initialize the first electrode or the second electrode of the drive transistor; and along a direction perpendicular to a plane of a substrate where the pixel driving circuit is located, the initialization control signal line at least partially overlaps with the initialization voltage line.

19. A display device, comprising a display panel, wherein the display panel comprises a display region, and the display region comprises a plurality of pixel driving circuits and a plurality of light-emitting elements;

wherein each of the plurality of pixel driving circuits comprises:

a drive transistor, an initialization transistor, a constant voltage signal line, and a variable voltage signal line;

wherein a voltage value on the constant voltage signal line is a constant value, and a voltage value on the variable voltage signal line varies with time, and both the constant voltage signal line and the variable voltage signal line extend along a first direction;

the constant voltage signal line comprises an initialization voltage line, and the variable voltage signal line comprises an initialization control signal line;

the drive transistor comprises a gate, a first electrode, and a second electrode, and the first electrode of the drive transistor is configured for writing a first power signal;

a first electrode of the initialization transistor is electrically connected to the initialization voltage line, a second electrode of the initialization transistor is electrically connected to the first electrode or the second electrode of the drive transistor, and a gate of the initialization transistor is electrically connected to the initialization control signal line and configured for turning on the initialization transistor according to a control signal on the initialization control signal line so as to initialize the first electrode or the second electrode of the drive transistor; and along a direction perpendicular to a plane of a substrate where the pixel driving circuit is located, the initialization control signal line at least partially overlaps with the initialization voltage line.

* * * * *